US012685028B2

(12) United States Patent
Le et al.

(10) Patent No.: US 12,685,028 B2
(45) Date of Patent: Jul. 14, 2026

(54) BUFFER LAYERS, INTERLAYERS, AND BARRIER LAYERS COMPRISING HEUSLER ALLOYS FOR SOT BASED SENSOR, MEMORY, AND STORAGE DEVICES

(71) Applicant: Western Digital Technologies, Inc., San Jose, CA (US)

(72) Inventors: Quang Le, San Jose, CA (US); Brian R. York, San Jose, CA (US); Cherngye Hwang, San Jose, CA (US); Xiaoyong Liu, San Jose, CA (US); Susumu Okamura, San Jose, CA (US); Michael A. Gribelyuk, San Jose, CA (US); Xiaoyu Xu, San Jose, CA (US); Randy G. Simmons, San Jose, CA (US); Kuok San Ho, Emerald Hills, CA (US); Hisashi Takano, Fujisawa (JP)

(73) Assignee: Western Digital Technologies, Inc., San Jose, CA (US)

( * ) Notice: Subject to any disclaimer, the term of this patent is extended or adjusted under 35 U.S.C. 154(b) by 545 days.

(21) Appl. No.: 18/197,495

(22) Filed: May 15, 2023

(65) Prior Publication Data

US 2024/0032437 A1     Jan. 25, 2024

Related U.S. Application Data

(60) Provisional application No. 63/391,956, filed on Jul. 25, 2022.

(51) Int. Cl.
*H10N 50/10* (2023.01)
*G01R 33/09* (2006.01)
(Continued)

(52) U.S. Cl.
CPC ........... *H10N 50/10* (2023.02); *G01R 33/093* (2013.01); *G11B 5/3909* (2013.01);
(Continued)

(58) Field of Classification Search
CPC ........ H10N 50/10; H10N 50/85; H10N 50/80; G01R 33/093; G01R 33/098;
(Continued)

(56) References Cited

U.S. PATENT DOCUMENTS 11,094,338 B1 *   8/2021   Hwang ................. G11B 5/315
2018/0254409 A1   9/2018   Nakada et al.
(Continued)

*Primary Examiner* — Steven Lim
*Assistant Examiner* — Michelle J. Kim
(74) *Attorney, Agent, or Firm* — Patterson + Sheridan, LLP

(57) ABSTRACT

The present disclosure generally relates to spin-orbit torque (SOT) devices comprising a bismuth antimony (BiSb) layer. The SOT devices further comprises a nonmagnetic buffer layer, a nonmagnetic interlayer, a ferromagnetic layer, and a nonmagnetic barrier layer. One or more of the barrier layer, interlayer, and buffer layer comprise a polycrystalline non-Heusler alloy material, or a Heusler alloy and a material selected from the group consisting of: Cu, Ag, Ge, Mn, Ni, Co, Mo, W, Sn, B, and In. The Heusler alloy is a full Heusler alloy comprising $X_2YZ$ or a half Heusler alloy comprising XYZ, where X is one of: Mn, Fe, Co, Ni, Cu, Ru, Rh, Pd, Ag, Ir, Pt, and Au, Y is one of: Ti, V, Cr, Mn, Fe, Co, Ni, Zn, Y, Zr, Nb, Mo, Hf, and W, and Z is one of: B, Al, Si, Ga, Ge, As, In, Sn, Sb, and Bi.

29 Claims, 10 Drawing Sheets

375

(51) Int. Cl.

| | |
|---|---|
| *G11B 5/39* | (2006.01) |
| *G11C 11/16* | (2006.01) |
| *H10B 61/00* | (2023.01) |
| *H10N 50/85* | (2023.01) |

(52) U.S. Cl.
CPC ............ *G11C 11/161* (2013.01); *H10B 61/00* (2023.02); *H10N 50/85* (2023.02)

(58) Field of Classification Search
CPC . G11B 5/3909; G11C 11/161; G11C 11/1675; G11C 11/18; H10B 61/00
See application file for complete search history.

(56) References Cited

U.S. PATENT DOCUMENTS

| | | | | |
|---|---|---|---|---|
| 2019/0288173 | A1* | 9/2019 | Kocevski | ............. H10N 10/857 |
| 2020/0341079 | A1 | 10/2020 | Swerts et al. | |
| 2021/0005235 | A1 | 1/2021 | Min et al. | |
| 2021/0249038 | A1* | 8/2021 | Le | ........................... H10N 52/80 |
| 2021/0305498 | A1* | 9/2021 | Sasaki | .................... H10N 50/85 |
| 2021/0336127 | A1* | 10/2021 | Le | ........................... H10N 52/80 |
| 2021/0408370 | A1* | 12/2021 | York | ..................... G11C 11/161 |
| 2022/0165470 | A1 | 5/2022 | Guo et al. | |
| 2023/0197132 | A1* | 6/2023 | Le | ........................... H10N 50/10 |
| | | | | 365/158 |

* cited by examiner

BUFFER LAYERS, INTERLAYERS, AND BARRIER LAYERS COMPRISING HEUSLER ALLOYS FOR SOT BASED SENSOR, MEMORY, AND STORAGE DEVICES

CROSS-REFERENCE TO RELATED APPLICATIONS

This application claims benefit of U.S. provisional patent application Ser. No. 63/391,956, filed Jul. 25, 2022, which is herein incorporated by reference.

BACKGROUND OF THE DISCLOSURE

Field of the Disclosure

Embodiments of the present disclosure generally relate to spin-orbit torque (SOT) device comprising a bismuth antimony (BiSb) layer.

Description of the Related Art

BiSb layers are narrow band gap topological insulators with both giant spin Hall effect and high electrical conductivity. BiSb is a material that has been proposed in various spin-orbit torque (SOT) device applications, such as for a spin Hall layer for magnetoresistive random access memory (MRAM) devices and energy-assisted magnetic recording (EAMR) write heads.

However, utilizing BiSb materials in commercial SOT applications can present several obstacles. For example, BiSb materials have low melting points, large grain sizes, significant Sb migration issues upon thermal annealing due to its film roughness, difficulty maintaining a desired (012) or (001) orientation for maximum spin Hall effect, and are generally soft and easily damaged by ion milling.

Therefore, there is a need for an improved SOT device utilizing BiSb layer(s) having a desired crystal orientation and a high signal-to-noise ratio.

SUMMARY OF THE DISCLOSURE

The present disclosure generally relates to spin-orbit torque (SOT) devices comprising a bismuth antimony (BiSb) layer. The SOT devices further comprises a nonmagnetic buffer layer, a nonmagnetic interlayer, a ferromagnetic layer, and a nonmagnetic barrier layer. One or more of the barrier layer, interlayer, and buffer layer comprise a polycrystalline non-Heusler alloy material, or a Heusler alloy and a material selected from the group consisting of: Cu, Ag, Ge, Mn, Ni, Co, Mo, W, Sn, and In. The Heusler alloy is a full Heusler alloy comprising $X_2YZ$ or a half Heusler alloy comprising XYZ, where X is one of: Mn, Fe, Co, Ni, Cu, Ru, Rh, Pd, Ag, Ir, Pt, and Au, Y is one of: Ti, V, Cr, Mn, Fe, Co, Ni, Zn, Y, Zr, Nb, Mo, Hf, and W, and Z is one of: B, Al, Si, Ga, Ge, As, In, Sn, Sb, and Bi.

In one embodiment, a SOT device comprises a first nonmagnetic layer comprising a polycrystalline non-Heusler alloy material, or a Heusler alloy and a material selected from the group consisting of: Cu, Ag, Ge, Mn, Ni, Co, Mo, W, Sn, B, and In, and a bismuth antimony (BiSb) layer disposed in contact with the first nonmagnetic layer.

In another embodiment, a SOT device comprises a texture layer, a nonmagnetic buffer layer disposed on the texture layer, a bismuth antimony (BiSb) layer over the nonmagnetic buffer layer, a nonmagnetic interlayer disposed on the BiSb layer, a ferromagnetic layer disposed on the nonmagnetic interlayer, and a nonmagnetic barrier layer disposed on the ferromagnetic layer, wherein one or more of the nonmagnetic barrier layer, the nonmagnetic interlayer, and the nonmagnetic buffer layer comprise a polycrystalline non-Heusler alloy material, or a Heusler alloy and a material selected from the group consisting of: Cu, Ag, Ge, Mn, Ni, Co, Mo, W, Sn, B, and In.

In yet another embodiment, a SOT device comprises a seed layer, a texture layer disposed on the seed layer, a ferromagnetic layer disposed on the texture layer, a nonmagnetic buffer layer disposed on the ferromagnetic layer, a bismuth antimony (BiSb) layer over the nonmagnetic buffer layer, and a nonmagnetic interlayer disposed on the BiSb layer, wherein one or more of the nonmagnetic interlayer and the nonmagnetic buffer layer comprise a polycrystalline non-Heusler alloy material, or a Heusler alloy and a material selected from the group consisting of: Cu, Ag, Ge, Mn, Ni, Co, Mo, W, Sn, B, and In.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

To facilitate understanding, identical reference numerals have been used, where possible, to designate identical elements that are common to the Figures. It is contemplated that elements disclosed in one embodiment may be beneficially utilized on other embodiments without specific recitation.

DETAILED DESCRIPTION

In the following, reference is made to embodiments of the disclosure. However, it should be understood that the disclosure is not limited to specific described embodiments.

Instead, any combination of the following features and elements, whether related to different embodiments or not, is contemplated to implement and practice the disclosure. Furthermore, although embodiments of the disclosure may achieve advantages over other possible solutions and/or over the prior art, whether or not a particular advantage is achieved by a given embodiment is not limiting of the disclosure. Thus, the following aspects, features, embodiments and advantages are merely illustrative and are not considered elements or limitations of the appended claims except where explicitly recited in a claim(s). Likewise, reference to "the disclosure" shall not be construed as a generalization of any inventive subject matter disclosed herein and shall not be considered to be an element or limitation of the appended claims except where explicitly recited in a claim(s).

The present disclosure generally relates to spin-orbit torque (SOT) devices comprising a bismuth antimony (BiSb) layer. The SOT devices further comprises a nonmagnetic buffer layer, a nonmagnetic interlayer, a ferromagnetic layer, and a nonmagnetic barrier layer. One or more of the barrier layer, interlayer, and buffer layer comprise a polycrystalline non-Heusler alloy material, or a Heusler alloy and a material selected from the group consisting of: Cu, Ag, Ge, Mn, Ni, Co, Mo, W, Sn, B, and In. The Heusler alloy is a full Heusler alloy comprising $X_2YZ$ or a half Heusler alloy comprising XYZ, where X is one of: Mn, Fe, Co, Ni, Cu, Ru, Rh, Pd, Ag, Ir, Pt, and Au, Y is one of: Ti, V, Cr, Mn, Fe, Co, Ni, Zn, Y, Zr, Nb, Mo, Hf, and W, and Z is one of: B, Al, Si, Ga, Ge, As, In, Sn, Sb, and Bi.

A BiSb layer having a (012) orientation or a (001) orientation has a significant spin Hall angle and high electrical conductivity. Therefore, a BiSb layer having a (012) orientation or a (001) orientation can form a SOT device. For example, a BiSb layer having a (012) orientation or a (001) orientation can be used as a spin Hall layer in a spin-orbit torque device in a magnetic recording head, e.g., as part of a write head (MAMR). In another example, a BiSb layer having a (012) orientation or a (001) orientation can be used in nano oscillator devices for reading head applications where a signal is detected in the frequency domain. In another example, a BiSb layer having a (012) orientation or a (001) orientation can be used as a spin Hall electrode layer in an MRAM device. The SOT device can be in a perpendicular stack configuration or an in-plane stack configuration. The SOT device can be utilized in, for example, MAMR writing heads, read head, nano-oscillator based reader, MRAM, artificial intelligence chips, and other applications.

Figure 1:
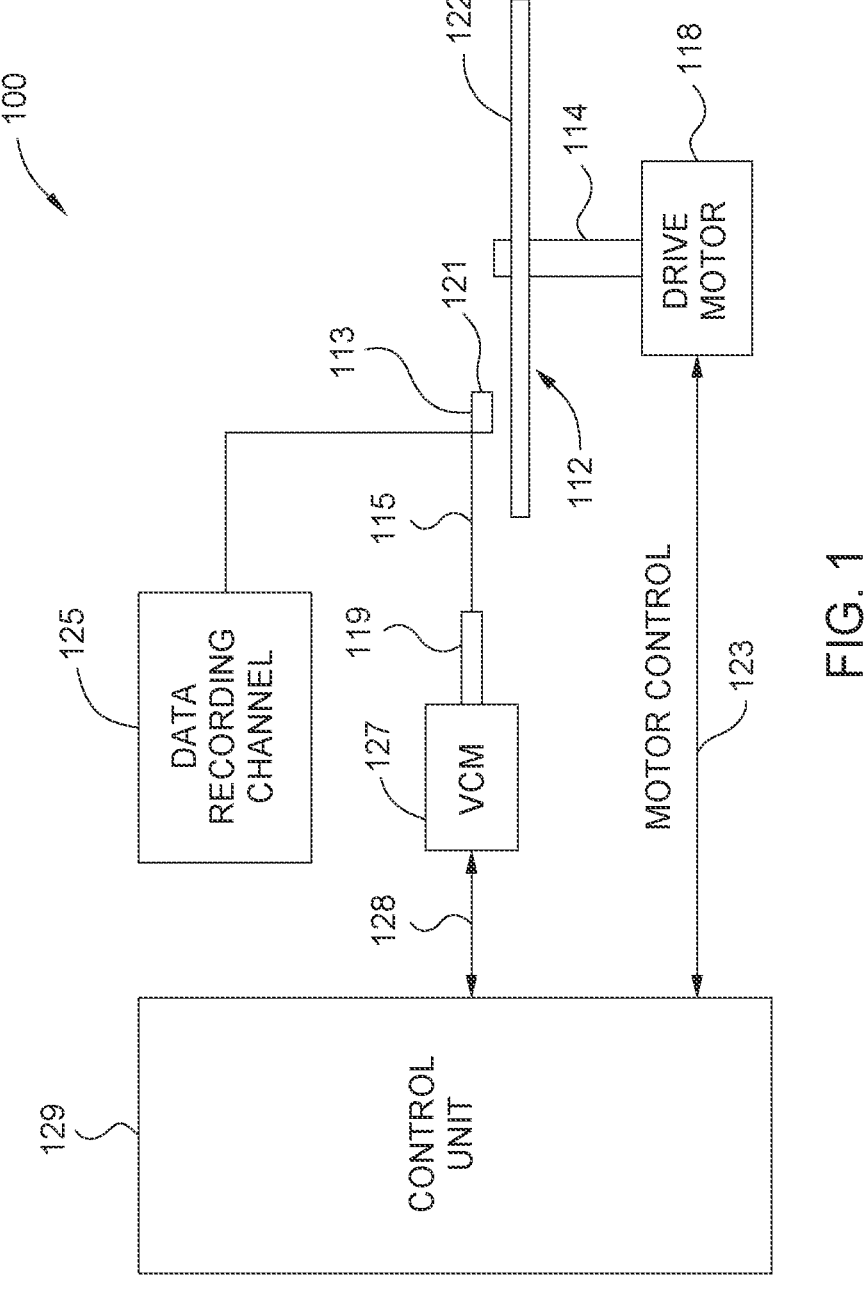
FIG. 1 is a schematic illustration of certain embodiments of a magnetic media drive including a magnetic recording head having a SOT device.

FIG. 1 is a schematic illustration of certain embodiments of a magnetic media drive 100 including a magnetic recording head having a SOT device. Such a magnetic media drive may be a single drive or comprise multiple drives. For the sake of illustration, a single disk drive 100 is shown according to certain embodiments. As shown, at least one rotatable magnetic disk 112 is supported on a spindle 114 and rotated by a drive motor 118. The magnetic recording on each magnetic disk 112 is in the form of any suitable patterns of data tracks, such as annular patterns of concentric data tracks (not shown) on the magnetic disk 112.

Figure 2:
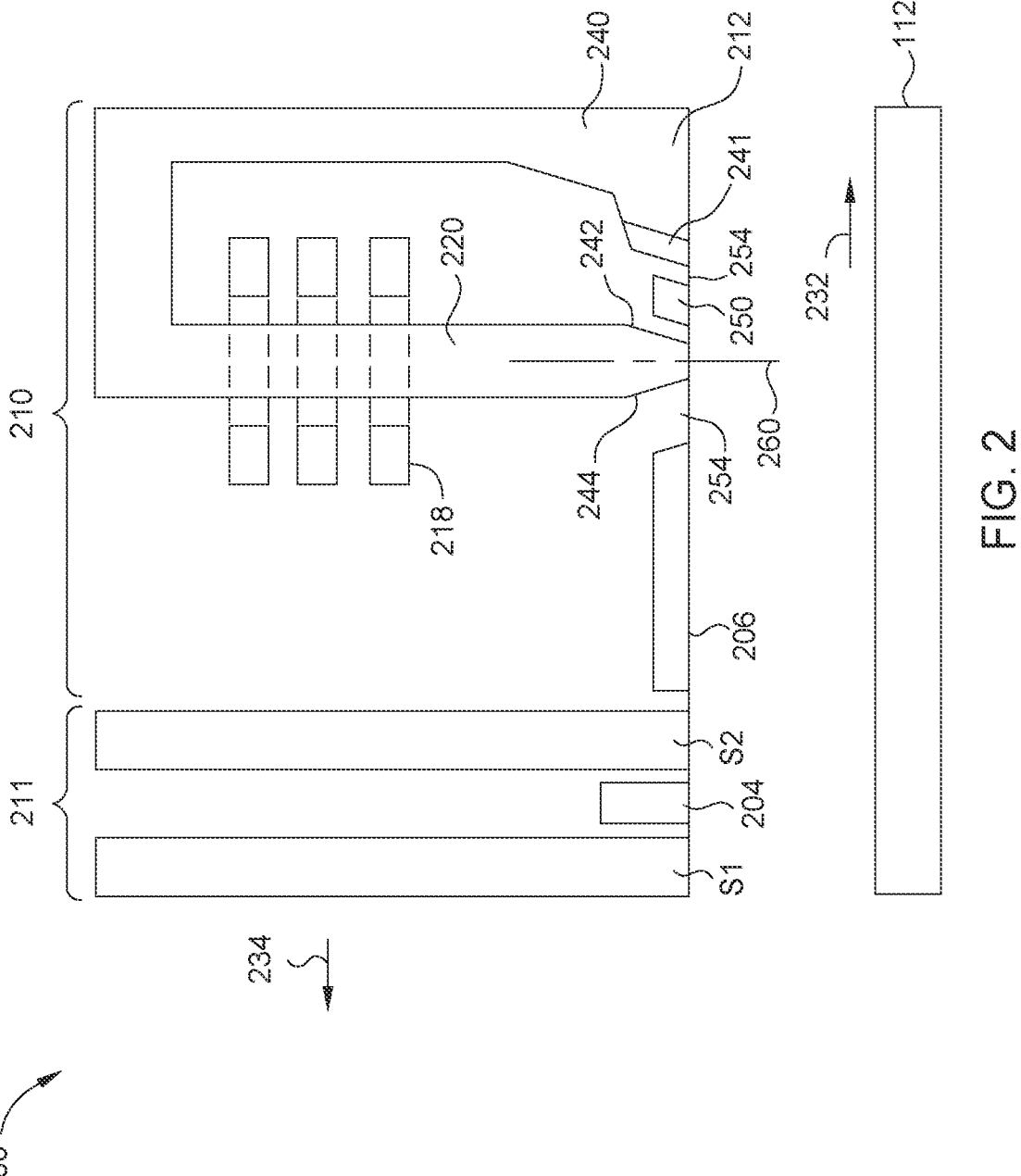
FIG. 2 is a fragmented, cross-sectional side view of certain embodiments of a read/write head having a SOT device.

At least one slider 113 is positioned near the magnetic disk 112, each slider 113 supporting one or more magnetic head assemblies 121 that include a SOT device. As the magnetic disk 112 rotates, the slider 113 moves radially in and out over the disk surface 122 so that the magnetic head assembly 121 may access different tracks of the magnetic disk 112 where desired data are written. Each slider 113 is attached to an actuator arm 119 by way of a suspension 115. The suspension 115 provides a slight spring force which biases the slider 113 toward the disk surface 122. Each actuator arm 119 is attached to an actuator means 127. The actuator means 127 as shown in FIG. 2 may be a voice coil motor (VCM). The VCM includes a coil movable within a fixed magnetic field, the direction and speed of the coil movements being controlled by the motor current signals supplied by control unit 129.

During operation of the disk drive 100, the rotation of the magnetic disk 112 generates an air bearing between the slider 113 and the disk surface 122 which exerts an upward force or lift on the slider 113. The air bearing thus counterbalances the slight spring force of suspension 115 and supports slider 113 off and slightly above the disk surface 122 by a small, substantially constant spacing during normal operation.

The various components of the disk drive 100 are controlled in operation by control signals generated by control unit 129, such as access control signals and internal clock signals. Typically, the control unit 129 comprises logic control circuits, storage means and a microprocessor. The control unit 129 generates control signals to control various system operations such as drive motor control signals on line 123 and head position and seek control signals on line 128. The control signals on line 128 provide the desired current profiles to optimally move and position slider 113 to the desired data track on disk 112. Write and read signals are communicated to and from write and read heads on the assembly 121 by way of recording channel 125.

The above description of a typical magnetic media drive and the accompanying illustration of FIG. 1 are for representation purposes only. It should be apparent that magnetic media drives may contain a large number of media, or disks, and actuators, and each actuator may support a number of sliders. It is to be understood that the embodiments discussed herein are applicable to a data storage device such as a hard disk drive (HDD) as well as a tape drive, such as those conforming to the LTO (Linear Tape Open) standards. As such, any reference in the detailed description to an HDD or tape drive is merely for exemplification purposes and is not intended to limit the disclosure unless explicitly claimed. For example, references to disk media in an HDD embodiment are provided as examples only, and can be substituted with tape media in a tape drive embodiment. Furthermore, reference to or claims directed to magnetic recording devices or data storage devices are intended to include at least both HDD and tape drive unless HDD or tape drive devices are explicitly claimed.

FIG. 2 is a fragmented, cross-sectional side view of certain embodiments of a read/write head 200 having a SOT device. It is noted while an SOT device is shown in both the read head and write head, this is for illustrative purposes only, and an SOT device may be independently integrated into either only the read head or only the write head in various embodiments, or in both the read head and the write head. The read/write head 200 faces a magnetic media 112. The read/write head 200 may correspond to the magnetic head assembly 121 described in FIG. 1. The read/write head 200 includes a media facing surface (MFS) 212, such as a gas bearing surface, facing the disk 112, a write head 210, and a magnetic read head 211. As shown in FIG. 2, the magnetic media 112 moves past the write head 210 in the direction indicated by the arrow 232 and the read/write head 200 moves in the direction indicated by the arrow 234.

In some embodiments, the magnetic read head 211 is a SOT read head that includes an SOT sensing element 204 located between SOT shields S1 and S2. The magnetic fields of the adjacent magnetized regions in the magnetic disk 112 are detectable by the SOT sensing element 204 as the recorded bits. In SOT sensing elements 204 comprising a BiSb layer, such as the SOT devices described in FIGS. 4A-4F, current flows perpendicular to the film plane, and the signal is read out by measuring the voltage in the BiSb layer generated by the inverse spin Hall effect. The SOT device of various embodiments can be incorporated into the read head 211.

The write head 210 includes a main pole 220, a leading shield 206, a trailing shield 240, and a coil 218 that excites the main pole 220. The coil 218 may have a "pancake" structure which winds around a back-contact between the main pole 220 and the trailing shield 240, instead of a "helical" structure shown in FIG. 2. In one embodiment, the write head 210 is a perpendicular magnetic recording (PMR) write head. In other embodiments, the write head 210 may use energy assisted magnetic recording (EAMR) technologies such as microwave assisted magnetic recording (MAMR) and heat assisted magnetic recording (HAMR).

In FIG. 2, a spin orbital torque (SOT) device 250 is shown as part of the write head structure to enable a MAMR recording effect, in one embodiment. As noted above, while an SOT device is shown in FIG. 2 for both the read head and the write head, the SOT devices are not required to be implemented in both. The SOT device 250 is formed in a gap 254 between the main pole 220 and the trailing shield 240. The main pole 220 includes a trailing taper 242 and a leading taper 244. The trailing taper 242 extends from a location recessed from the MFS 212 to the MFS 212. The leading taper 244 extends from a location recessed from the MFS 212 to the MFS 212. The trailing taper 242 and the leading taper 244 may have the same degree of taper, and the degree of taper is measured with respect to a longitudinal axis 260 of the main pole 220. In some embodiments, the main pole 220 does not include the trailing taper 242 and the leading taper 244. Instead, the main pole 220 includes a trailing side (not shown) and a leading side (not shown), and the trailing side and the leading side are substantially parallel. The main pole 220 may be a magnetic material, such as a FeCo alloy. The leading shield 206 and the trailing shield 240 may be a magnetic material, such as a NiFe alloy. In certain embodiments, the trailing shield 240 can include a trailing shield hot seed layer 241. The trailing shield hot seed layer 241 can include a high moment sputter material, such as CoFe, CoFeNi, or FeXN, where X includes at least one of Rh, Al, Ta, Zr, Co, and Ti. In certain embodiments, the trailing shield 240 does not include a trailing shield hot seed layer.

In some embodiments, the read head 211 is a spin torque oscillator (STO) read head with an STO oscillator sensing element 204 located between shields S1 and S2. The magnetic fields of the adjacent magnetized regions in the magnetic disk 112 are detectable by the STO sensing element 204 as the recorded bits. The STO sensing elements 204 comprise a BiSb layer, such as an SOT device of FIGS. 4A-4F. The STO reader may be operated in a 2-terminal or a 3-terminal configuration, with an in-plane current flowing inside SOT structure while a small sensing current flows perpendicular to the film plane, and the signal is read out by measuring the frequency of magnetic layer precession. The SOT device of various embodiments can be incorporated into the read head 211.

Figure 3A:
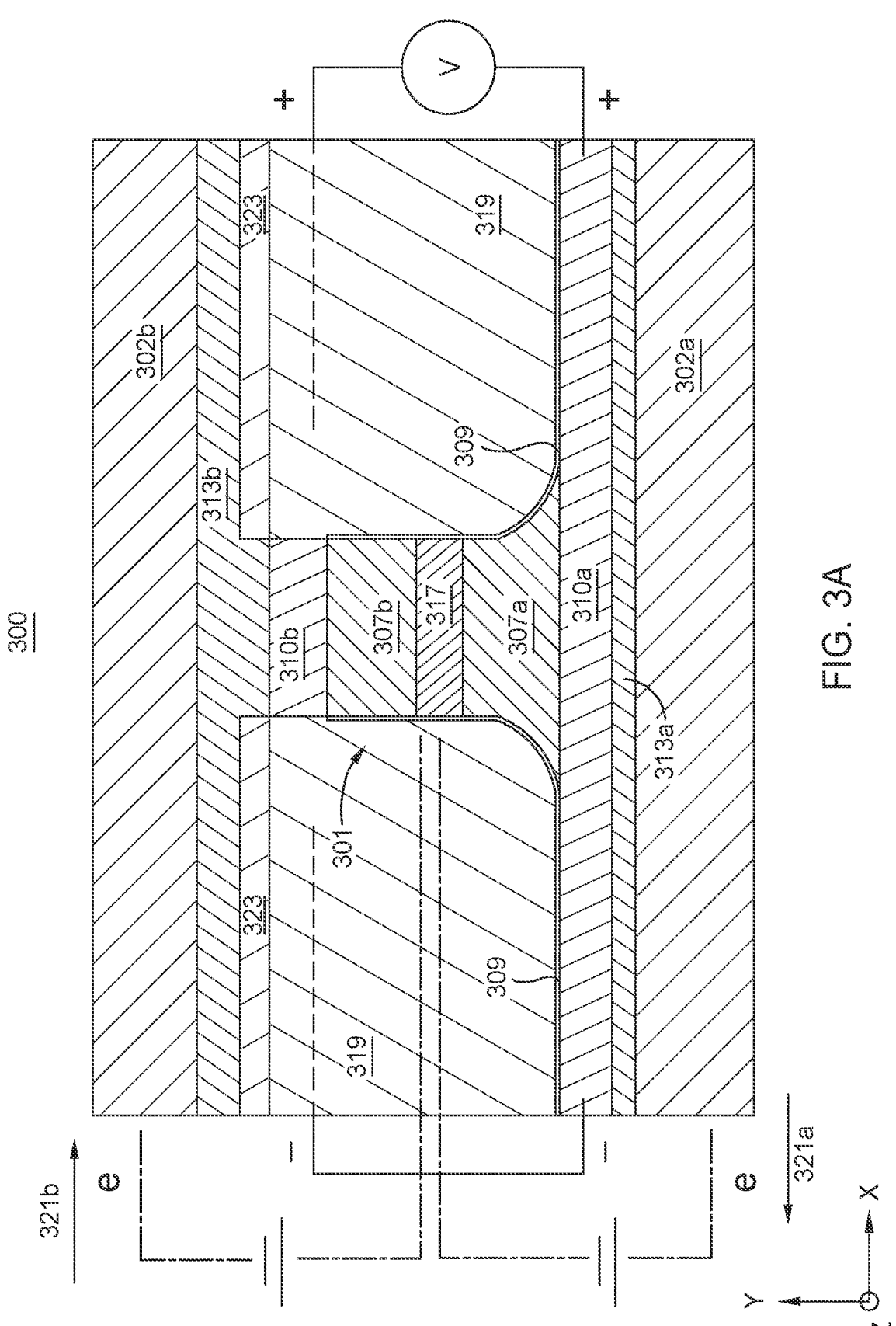
FIGS. 3A-3C illustrate MFS views of read heads comprising an SOT device, according to various embodiments.
Figure 3B:
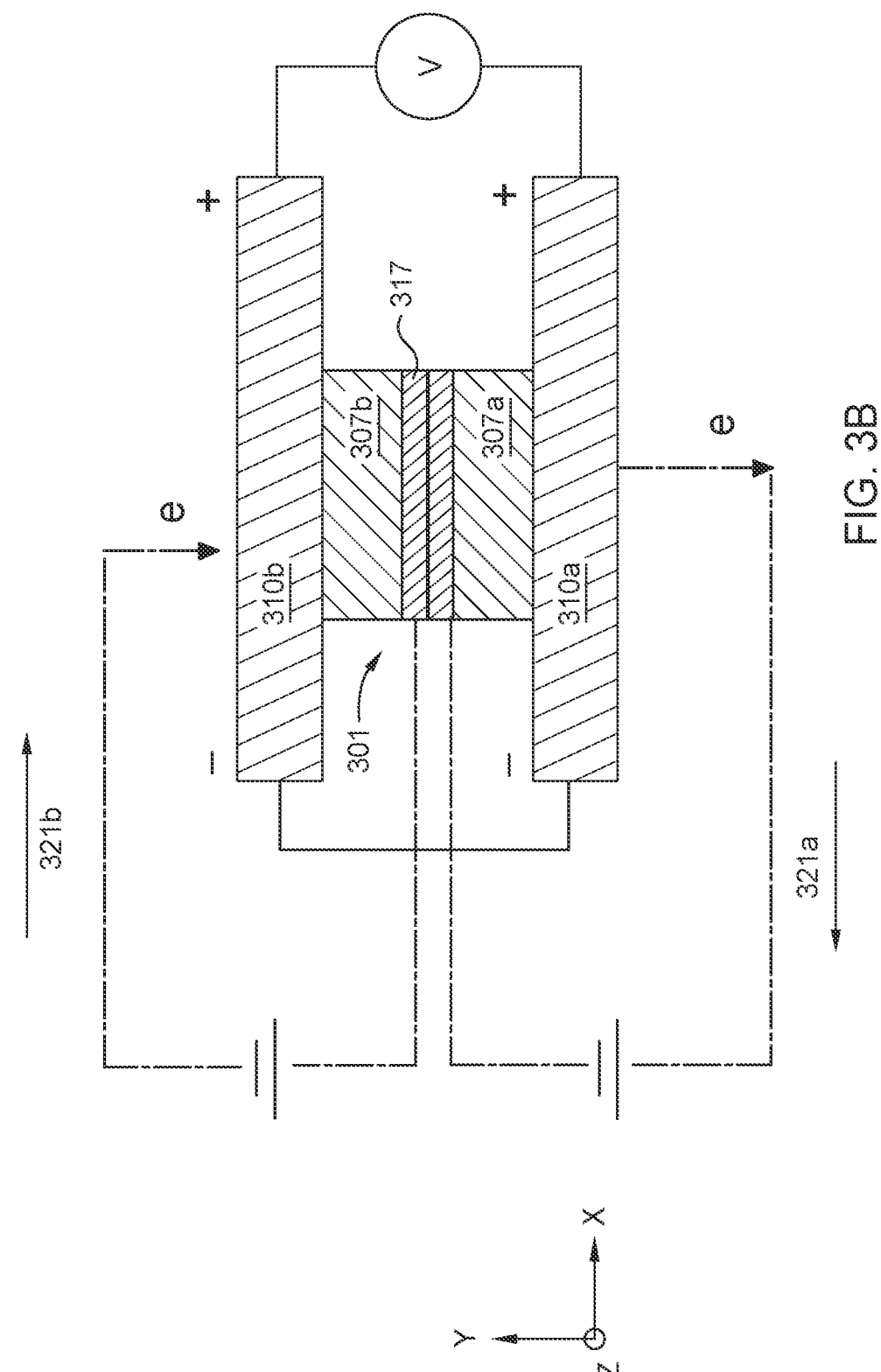
Figure 3C:
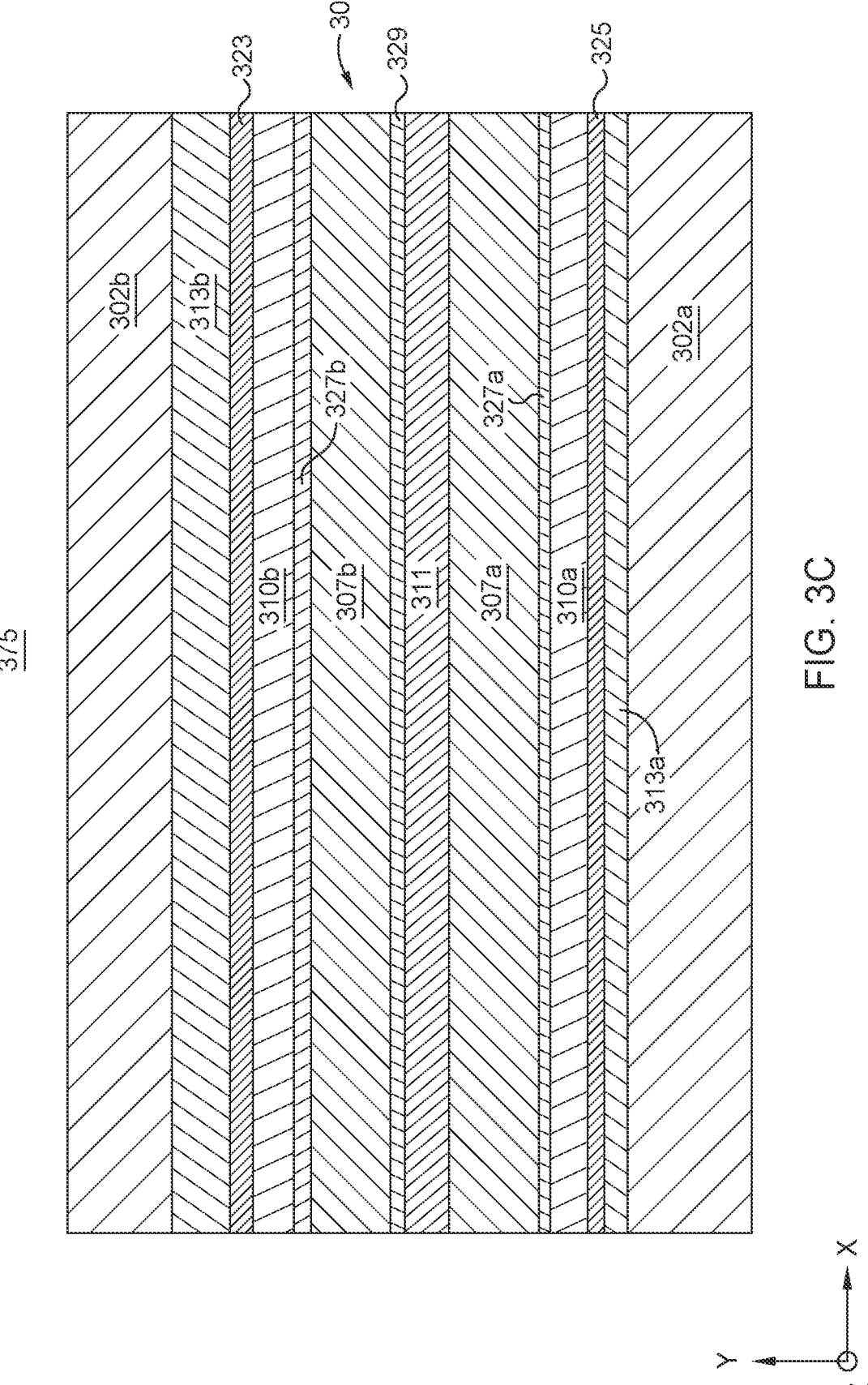

FIGS. 3A-3C illustrate MFS views of read heads 300, 350, 375, respectively, comprising an SOT device 301, according to various embodiments. The read heads 300, 350, 375 may be the read head 211 of FIG. 2. The SOT device 301 of each read head 300, 350, 375 may be the SOT devices 400, 450, 500 of FIGS. 4A-5. Each read head 300, 350, 375 comprises a SOT device 301 having dual free layers 307a, 307b.

The read head 300 of FIG. 3A comprises a first shield 302a, a first insulation layer 313a disposed on the first shield 302a, a first spin Hall effect layer (SHL) 310a disposed on the insulation layer 313a, a first free layer (FL) 307a disposed on the first SHL 310a, a gap layer 317 disposed on the first FL 307a, a second FL 307b disposed on the gap layer 317, a second SHL 310b disposed on the second FL 307b, a second insulation layer 313b disposed on the second SHL 310b, and a second shield 302b disposed on the second insulation layer 313b. The first and second SHLs 310a, 310b may each individually comprise bismuth antimony (BiSb). The first and second FLs 307a, 307b may each individually comprise CoFeB, Co, CoFe, or NiFe. The first and second shields 302a, 302b may each individually comprise a magnetic material, such as NiFe. The first and second insulation layers 313a, 313b may each individually comprise insulating material like SiN, or an oxide like MgO and can be used in combination with a Heusler alloy layer (discussed below in FIGS. 4A-5) adjacent to the BiSb layer to maintain texture and control Bi and Sb interdiffusion.

Side shields 319 are disposed adjacent to the SOT device 301 in the x-direction. The side shields 319 may comprise a magnetic material, such as NiFe. A third insulation layer 309 is disposed on the first SHL 310a and between the SOT device 301 and the side shields 319. The second SHL 310b is disposed in contact with the side shields 319. An antiferromagnetic cap layer 323 is disposed between the side shields 319 and the second insulation layer 313b. The first and second shields 302a, 302b, the first SHL 310a, and the first and second insulation layers 313a, 313b used in combination with a Heusler alloy layer (discussed below in FIGS. 4A-5) to control texture and interdiffusion, may each individually have a greater length in the x-direction than the first and second FLs 307a, 307b, the gap layer 317, and the second SHL 310b. A first current 321a flows from the first shield 302a into the gap layer 317, and a second current 321b flows from the gap layer 317 into the second shield 302b. A voltage may be applied to the first and second SHLs 310a, 310b.

The read head 350 of FIG. 3B is similar to the read head 300 of FIG. 3A; however, the read head 350 does not comprise insulation layers or shields. In the read head 350, the first FL 307a is disposed on the first SHL 310a, and an interlayer comprising a Heusler alloy, as discussed below in FIGS. 4A-5, could be used in combination with a nonmagnetic barrier in between the FL 307a and SHL layer 310a to reduce BiSb migration. The gap layer 317 is disposed on the first FL 307a, the second FL 307b is disposed on the gap layer 317, and the second SHL 310b is disposed on the second FL 307b and a buffer layer comprising a Heusler alloy (discussed below in FIGS. 4A-5) in combination with a nonmagnetic barrier layer could be used to control the (012) crystal orientation growth of the SHL 310b. The first and second SHLs 310a, 310b have a greater length in the x-direction than the first and second FLs 307a, 307b and the gap layer 317. A first current 321a flows from the first SHL 310a into the gap layer 317, and a second current 321b flows from the gap layer 317 into the second SHL 310b. A voltage may be applied to the first and second SHLs 310a, 310b.

The read head 375 of FIG. 3C is similar to the read head 300 of FIG. 3A; however, the read head 375 further comprises seed layers 325, 329 and interlayers 327a, 327b. The read head 375 comprises the first shield 302a, the first insulation layer 313a disposed on the first shield 302a, a first seed layer 325 disposed on the insulation layer 313a, the first SHL 310a disposed on the first seed layer 325, a first interlayer 327a disposed on the first SHL 310a, the first FL 307a disposed on the first interlayer 327a, the gap layer 311 disposed on the first FL 307a, a second seed layer 329 disposed on the gap layer 311, the second FL 307b disposed on the second seed layer 329, a second interlayer 327b disposed on the second FL 307b, the second SHL 310b disposed on the second interlayer 327b, a cap layer 323 disposed on the second SHL 310b, the second insulation layer 313b disposed on the cap layer 323, and a second shield 302b disposed on the second insulation layer 313b. The capping layer 323 may comprise a migration barrier like a Heusler alloy layer (discussed below in FIGS. 4A-5) optionally in combination with an additional nonmagnetic migration barrier adjacent to the BiSb to control Bi, Sb migration. In one embodiment, each layer of the read head 375 has a same length in the x-direction, though they may vary in other embodiments.

The cap layer 323 comprises a nonmagnetic material selected from the group consisting of SiN, TiN, $Al_2O_3$, $SiO_2$, NiFeTa, NiTa, NiW, NiFeW, CoHf, CoFeHf, Pt, Co, Cu, Ni, NiCu, CoCu, Ru, Ta, Cr, Au, Rh, other non-magnetic materials, and combinations thereof. The first seed layer 325 comprise a silicide or GeNiFe layer optionally in combination with another non-magnetic barrier. The second seed layer 329 may comprise GeNiFe layer optionally in combination with another non-magnetic barrier. The first interlayer 327a and the second interlayer 327b may each individually comprise a nonmagnetic Si or Ge transition metal alloy layer like a NiFeGe or CoFeGe layer, a Heusler alloy or other alloy in combination with a material selected from the group consisting of: Cu, Ag, Ge, Mn, Ni, Co, Mo, W, Sn, and In, or in combination with another nonmagnetic barrier to control BiSb intermixing and maintain BiSb texture.

While FIGS. 3A-3C each individually illustrates dual ferromagnetic or dual free layer SOT devices 301, the read heads 300, 350, 375 of FIGS. 3A-3C may instead be utilized with a single ferromagnetic or single free layer SOT device, or a single ferromagnetic or single free layer SOT device comprising an anti-ferromagnetic (AFM) layer, where the AFM layer may comprise a single or multiple layers of PtMn, NiMn, IrMn, IrMnCr, CrMnPt, FeMn, other antiferromagnetic materials, or combinations thereof. An exemplary single ferromagnetic or single free layer SOT device may comprise a substrate or shield, a buffer layer disposed on the substrate, a free layer disposed on the buffer layer, an interlayer deposed on the free layer, an SHL disposed on the interlayer, and a cap layer disposed on the SHL. An exemplary single ferromagnetic or single free layer SOT device comprising an AFM layer may comprise the AFM layer disposed adjacent to the single ferromagnetic or single free layer SOT device, where the AFM layer is recessed from the MFS. Additionally, the single or dual free layer based SOT devices described may be used in magnetic sensor applications outside of a read sensor/reader in magnetic recording, and such sensors may be similarly fabricated as the various reader stacks shown or described.

Figures 4A, 4B:
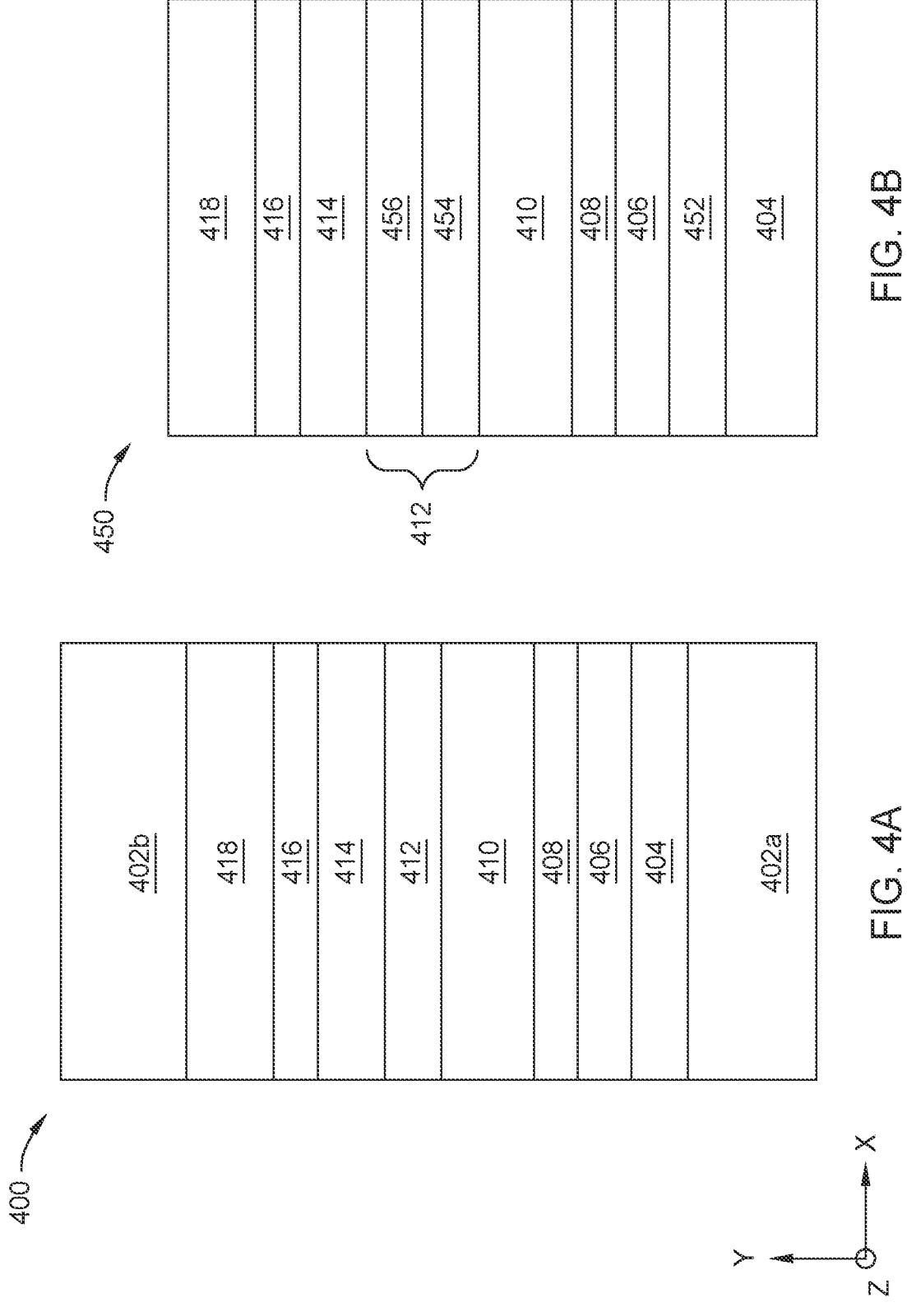
FIGS. 4A-4B illustrate top SOT devices, according to various embodiments.
Figure 5:
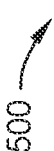
FIG. 5 illustrates a bottom SOT device, according to another embodiment.
Figure 5:
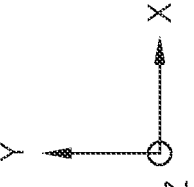

FIGS. 4A-4B illustrate top spin-orbit torque (SOT) devices 400, 450, according to various embodiments. FIG. 5 illustrates a bottom SOT device 500, according to another embodiment. Each of the SOT devices 400, 450, 500 may include additional layers not shown in FIGS. 4A-5. The SOT devices 400, 450, 500 may each individually be used in the magnetic recording head of the drive 100 of FIG. 1 or other suitable magnetic media drives, such as the read head 211 and/or write head 210 of FIG. 2, and one or more of the read heads 300, 350, 375 of FIGS. 3A-3C. For example, the first and second seed layers 325, 329 and the first and second interlayers 327a, 327b of FIG. 3C may be the buffer layer 416 and/or the interlayer 412 discussed below. Additionally, the various SOT devices/stacks of FIGS. 4A-5 may be used in a magnetic sensor and as part of a memory structure in MRAM such as that example shown in FIG. 8.

Furthermore, while the SOT device 400, 450, 500 are referred to as SOT devices, the SOT device 400, 450, 500 may each individually function as spin torque oscillator (STO) devices. Aspects of each SOT device 400, 450, 500 may be used in combination with one another. When the SOT device 400, 450, 500 are used in a write head, the current flows in-plane to the SOT layer or bismuth antimony (BiSb) layer 410, and the ferromagnetic (FM) or free layer is oscillated by the SOT generated by the spin Hall effect in the BiSb layer 410.

The SOT device 400 of FIG. 4A comprises a first electrode 402a, a seed layer 404 disposed on the first electrode 402a, a buffer layer 406 disposed on the seed layer 404, an optional nucleation layer 408 disposed on the buffer layer 406, a BiSb layer 410 disposed on the optional nucleation layer 408 (or the buffer layer 406), an interlayer 412 disposed on the BiSb layer 410, a FM layer 414 disposed on the interlayer 412, a barrier layer 416 disposed on the FM layer 414, a cap layer 418 disposed on the barrier layer 416, and a second electrode 402b disposed on the cap layer 418. While shown, the first and second electrodes 402a, 402b are optional.

The SOT device 450 of FIG. 4B is similar to the SOT device 400 of FIG. 4A; however, the SOT device 450 further comprises a texture layer 452 disposed between the seed layer 404 and the buffer layer 406, and the interlayer 412 is a multilayer structure comprising a first interlayer 454 disposed on the BiSb layer 410 and a second interlayer 456 disposed on the first interlayer 454. As such, the SOT device 450 comprises the seed layer 404, the texture layer 452 disposed on the seed layer 404, the buffer layer 406 disposed on the texture layer 452, the optional nucleation layer 408 disposed on the buffer layer 406, the BiSb layer 410 disposed on the optional nucleation layer 408 or the buffer layer 406, the first interlayer 454 disposed on the BiSb layer 410, the second interlayer 456 disposed on the first interlayer 454, the FM layer 414 disposed on the second interlayer 456, the barrier layer 416 disposed on the FM layer 414, and the cap layer 418 disposed on the barrier layer 416. While not shown in FIG. 4B, the SOT device 450 may comprise the first and second electrodes 402a, 402b.

The SOT device 500 of FIG. 5 is similar to the SOT devices 400 and 450 of FIGS. 4A-4B; however, the FM layer 414 is disposed below the BiSb layer 410. The SOT device 500 of FIG. 5 comprises the seed layer 404, the texture layer 452 disposed on the seed layer 404, the FM layer 414 disposed on the texture layer 452, the buffer layer 406 disposed on the FM layer 414, the BiSb layer 410 disposed on the buffer layer 406, the interlayer 412 disposed on the BiSb layer 410, and the cap layer 418 disposed on the interlayer 412. While not shown in FIG. 5, the SOT device 500 may comprise the first and second electrodes 402a, 402b and/or the nucleation layer 408.

In the SOT devices 400, 450, 500, the BiSb layer 410 may be the first SHL 310a and/or the second SHL 310b of FIGS. 3A-3C. The BiSb layer 410 may have a thickness in the y-direction of about 60 A to about 200 A. The BiSb layer 410 may be referred to herein as a spin Hall effect (SHE) layer, a spin orbit torque (SOT) layer, or a topological insulator.

The BiSb layer 410 may comprise undoped BiSb or doped BiSbX, where the dopant is less than about 10%, and where X is extracted from elements which don't readily interact with either Bi or Sb, such as Cu, Ag, Ge, Mn, Ni, Co Mo, W, Sn, B, In, or in alloy combinations with one or more of aforementioned elements, like CuAg, CuNi, CoCu, AgSn. The BiSb layer 410 may have a (012) crystal orientation or a (001) crystal orientation.

In embodiments where the SOT devices 400, 450, 500 comprise the first and second electrodes 402a, 402b, the first and second electrodes 402a, 402b may each individually comprise a nonmagnetic, low resistivity metal. For example, the first and second electrodes 402a, 402b may each comprise Ru, CuAg, Ta(alpha), W(alpha), Mo, Cu, Ag, Rh, Pt, among others. Low to moderate resistivity magnetic materials can be used if the first and second electrodes 402a, 402b are far enough away not to interfere with FM/SOT interactions. The thickness of each of the first and second electrodes 402a, 402b in the y-direction is greater than or equal to about 100 Å.

The cap layer 418 may comprise nonmagnetic, high resistivity materials, such as: thin ceramic oxides or nitrides of TiN, SiN, and MgO; amorphous/nanocrystalline metals such as NiFeTa, NiTa, NiHf, NiFeHf, CoHf, CoFeHf, NiWTa, NiFeW, NiW, WRe, beta-Ta, and beta-W; or nitrides, oxides, or borides of above-mentioned elements, compounds, and/or alloys such as NiTaN, NiFeTaN, NiWTaN, NiWN, WReN, TaN, WN, TaOx, WOx, WB, HfB, NiHfB, NiFeHfB, CoHfB, and CoFeHfB, where x is a numeral. In some embodiments, lower atomic number (Z) materials are preferred in the cap layer 418 to reduce sputter intermixing with the FM layer 414, but high Z alloys can be used, if used in combination with a migration barrier beneath, or if the high Z elements are used with a high resistive oxide, nitride, or boride. The cap layer 418 can comprise multilayer combinations of the above-mentioned materials, and the overall thickness of the cap layer 418 in the y-direction is less than or equal to about 100 Å (nominally about 15 Å to about 50 Å). Furthermore, lower resistivity metals may be used in the cap layer 418 if the barrier layer 416 or the bottom portion of the cap layer 418 has a high resistivity and is thick enough to reduce FM shunting.

The FM layer 414 has a thickness of about 5 Å to about 15 Å in the y-direction, and may comprise NiFe, CoFe, NiFeX, CoFeX, FeX, or NiX, where X=Co, Ni, Cu, Si, Al, Mn, Ge, Ta, Hf, and B. The FM layer 414 may comprise any magnetic layer combination or alloy combination of these elements that can yield a low coercivity, negative magnetostrictive FM layer 414 or in multilayer combinations with other higher polarizing materials like Heusler alloys or high Ni containing alloy FM layers.

The seed layer 404 may comprise the same material(s) as the cap layer 418, and the seed layer 404 may be multilayered. For example, the seed layer 404 may comprise: nonmagnetic, high resistivity materials, such as thin ceramics of TiN, SiN, MgO, and $Al_2O_3$; amorphous/nanocrystalline metals such as NiFeTa, NiTa, NiHf, NiFeHf, CoHf, CoFeHf, NiWTa, NiFeW, NiW, WRe, beta-Ta, and beta-W; or nitrides, oxides, or borides of above-mentioned elements, compounds, and/or alloys such as NiTaN, NiFeTaN, NiWTaN, NiWN, WReN, TaN, WN, TaOx, WOx, WB, HfB, NiHfB, NiFeHfB, CoHfB, and CoFeHfB, where x is a numeral. Since the seed layer 404 is underneath or below the FM layer 414 in each SOT device 400, 450, 500, high Z amorphous alloys in the seed layer 404 are not as detrimental to SOT intermixing as they would be in the cap layer 418.

The thickness of the seed layer 404 in the y-direction is less than or equal to about 100 Å (nominally about 15 Å to about 50 Å). The seed layer 404 and the cap layer 418 can each individually be thicker if magnetic electrodes are used in the device stack.

The texture layer 452 may comprise RuAl, where Ru is between about 45% to about 55%, CrMo, where Mo is between about 25% to about 50%, or multilayers of CrMoX with CrX, where X=Ti, Ru, Mo, or W. The texture layer 452 has a (001) texture. The texture layer 452 may have a B2 or BCC crystalline structure where the a-axis lattice parameter is about 2.95 Å to about 3.05 Å. The texture layer 452 has a thickness in the y-direction of about 30 Å to about 50 Å.

Each of the buffer layer 406, the interlayer 412, the barrier layer 416, and the nucleation layer 408 comprises magnetic or nonmagnetic Heusler alloys, where the Heusler alloys may be full Heusler alloys (i.e., $X_2YZ$) or half Heusler alloys (i.e., XYZ). Full $X_2YZ$ type Heusler alloys generally have L21, cF16, or C1b type structures with an a-axis between about 5.70 Å and about 6.20 Å, which perfectly matches to RuAl or CrMo texturing layer 452. Half XYZ type Heusler alloys generally have a B2 type or Pm-3m type structure with a-axis between about 2.85 Å to about 3.10 Å. However, the type or structure may vary with respect to both half and full Heusler alloys. For instance, RuMnAl, RhMnAl, and $Al_2CuRh$, have a Pm-3m structure, and $Ni_2MnAl$ and $Mn_2NiAl$ have cF16 structures while $Al_2NiMn$ has a B2 structure.

With both full and half Heusler alloys, X may be one of Li, Mg, Mn, Fe, Co, Ni, Cu, Ru, Rh, Pd, Ag, Cd, Ir, Pt, or Au; Y may be one of Li, Be, Sc, Ti, V, Cr, Mn, Fe, Co, Ni, Zn, Y, Zr, Nb, Mo, Hf, or W; and Z may be one of B, Mg, Al, Si, Zn, Ga, Ge, As, In, Sn, Sb, Pb, or Bi. Some nonmagnetic Heusler alloy examples include $Ti_2MnAl$, $Fe_2VAl$ (a-axis=5.78 Å), $Cr_2CoAl$ (a-axis=5.88 Å), CoTiSb (a-axis=5.88 Å), $Mn_2VSi$, $V_2VAl$ (a-axis=6.14 Å), $[Mn_{1-x}Co_x]_2VAl$ (x=0.5) (a-axis=6.05 Å), $[Mn_{1-x}Co_x]_2VSi$ (x=0.25) (a-axis=6.18 Å), and CoMnNbAl, CoZrFeAl. Magnetic Heusler alloy examples having large spin polarizations include $Co_2MnSb$ (a-axis=5.94 Å), $Co_2MnGe$ (a-axis=5.75 A), CoMnSb (a-axis=5.90 Å) NiMnSb, $Co_2FeGe$, $Co_2MnSn$, and $Co_2MnFeGe$, each of which does not readily mix with the BiSb layer 410.

Moreover, each of the buffer layer 406, the interlayer 412, the barrier layer 416, and the nucleation layer 408 comprises: (1) amorphous/nanocrystalline layers formed from Heusler alloys in combination with elements, or alloy layers that don't readily mix with the SOT or FM layers, or uniform alloys formed by co-sputtering Heusler alloys with other elements, or alloys which don't readily intermix with SOT or FM layer, or (2) polycrystalline Heusler alloys, which are epitaxial layers in the SOT devices 400, 450, 500. With respect to amorphous/nanocrystalline buffer layers 406, nucleation layers 408, interlayers 412, and barrier layers 416, thin polycrystalline Heusler alloys (both magnetic and nonmagnetic, and full or half Heusler alloys) can be used when alloyed with other elements that don't readily mix with the BiSb layer 410, such as Cu, Ag, Ge, Mn, Ni, Co Mo, W, Sn, B, and In, or in alloy combinations with one or more of aforementioned elements, such as CuAg, CuNi, CoCu, AgSn. The nucleation layer 408 can also be just very thin (e.g., dusting) layers of these aforementioned elements, or in very thin alloy combination of these elements like CuAg, CuNi, CoCu, and AgSn.

Utilizing amorphous or nanocrystalline layers formed from Heusler alloys alloyed with other elements that don't readily mix with the BiSb layer 410 forms effectively nonmagnetic amorphous/nanocrystalline buffer and nucleation layers 406, 408 in several situations: (1) after deposition and room temperature (RT) intermixing; (2) post annealing prior to the BiSb layer 410 deposition; (3) in single uniform composition layer nonmagnetic amorphous/nanocrystalline alloy depositions with single alloy targets; or (4) co-sputtered with targets which contain the elements of the Heusler alloy and the non-readily mixed multi-elemental combination of elements mentioned above.

The interlayer 412 and the barrier layer 416 are formed in a similar fashion as the buffer and nucleation layers 406, 408 (although the nucleation layer 408 can also be just these aforementioned elements or any nonmagnetic alloy combination of these elements); however, it is not necessary that after deposition and RT intermixing that the resulting graded interlayer 412 or barrier layer 416 be amorphous as long as the resulting layer has a high resistance and reduces interlayer 412/barrier layer 416 intermixing with the BiSb layer 410 or intermixing with the FM layer 414.

With respect to polycrystalline Heusler alloys, thin layers of Heusler alloys, both magnetic and nonmagnetic, full or half Heusler alloys, can be used as the buffer layer 406, the interlayer 412, the barrier layer 416, and/or the nucleation layer 408 in (100) textured layer SOT devices (SOT orientation in this scenario is (012)). Heusler alloys generally have higher resistivities then the FM layer 414, and transport spin currents or yield high spin polarization, while providing and maintaining (100) growth. Heusler alloys further have excellent lattice matching capabilities to MgO tunnel barrier layers and to bcc FM alloys. (100) texturing layers, such as the texture layer 452, can be used to establish the (100) texture, and non-magnetic Heusler $X_2YZ$ or XYZ having cF16 (C1b, L21) or B2 structures can be used to transmit the texture to the BiSb layer 410, which in turn grows a strong (012) texture for the BiSb layer 410 with an epitaxial bcc, B2, or C1b, cF16, L21 Heusler interlayer to produce a strong epitaxial (100) texture for the bcc or B2 FM layer 414.

Other non-Heusler, nonmagnetic materials that could be used for one or more of the epitaxial buffer layer 406, interlayer 412, and/or barrier layer 416 for epitaxial growth are: B2 or bcc materials, such as NiAl, RuAl, RhAl, $Mn_3Al$, V, Mo, W, TiW, CrX, where x=Ti, Ru, Mo, or W; CrMo, where Mo is between about 20% to about 50%, CrMoTi, Cr, MoV, CrMoW; or CrXY, where X and Y are each individually selected from the group consisting of: Al, Ti, Mn, Co, Ni, Ru, Mo, Rh, W, and V.

In some embodiments, the barrier layer 416 can be formed from thin ceramic oxide or nitride layers like TiN, WN, SiN, and $Al_2O_3$, and MgO can be used as the barrier layer 416 or in combination with other high resistive nonmagnetic material layers. The top portion of a multilayer barrier layer 416 (not in direct contact with the FM layer 414) may also be comprise of high resistivity heavier metal amorphous or amorphous/nanocrystalline metals like NiFeTa, NiTa, NiHf, NiFeHf, CoHf, CoFeHf, NiWTa, NiFeW, NiW, and WRe; nanocrystalline metals like beta-Ta and beta-W; or nitrides, oxides, or borides of the aforementioned elements or alloys like NiTaN, NiFeTaN, NiWTaN, NiWN, WReN, TaN, WN, TaOx, WOx, TaBx, WBx, HfBx, NiHfB, NiFeHfB, and CoHfB, where x is a numeral. The bottom portion of the barrier layer 416 can be an amorphous/nanocrystalline material formed from Heusler alloys or other magnetic alloy materials when combined with aforementioned non-interacting elements or alloy combinations of those elements. Higher resistivity nonmagnetic alloys which do not interact with the FM layer 414, such as CuAg, CuNi, NiAg, CoCu, NiAl, RuAl, RhAl, and AgSn, can also be used as the barrier layer 416. The barrier layer 416 can also be a polycrystalline nonmagnetic Heusler alloy or half Heusler alloy, or other B2 or bcc materials, such as NiAl, RuAl, RhAl, $Mn_3Al$, V, Mo, W, TiW, and CrX, where x=Ti, Ru, Mo, or W; CrMo, where Mo is between about 20% to about 50%, CrMoTi, Cr, MoV, CrMoW; or CrXY, where X and Y are each individually selected from the group consisting of: Al, Ti, Mn, Co, Ni, Ru, Mo, Rh, W, and V; or in any combination of these material layers which has a higher resistive non-interacting layer next to the FM layer, among others.

When alloyed with nonmagnetic materials that do not readily intermix with FM layer 414, examples of high resistive amorphous barrier layer 416 materials include Ge/CoFe/CuAg (as used here "/" denotes separate sub-layers in a stack or layer) (where Ge/CoFe may form a single layer at room temperature or may be deposited as an alloy layer, and where Ge has a thickness of about 6 Å, CoFe has a thickness of about 4 Å, and CuAg has a thickness of about 3 Å), CuAg/Ge/CoFe/CuAg (where CuAg/Ge/CoFe may form a single layer at room temperature or may be deposited as an alloy layer, and where CuGe has a thickness of about 3 Å, Ge has a thickness of about 5 Å, CoFe has a thickness of about 4 Å, and CuAg has a thickness of about 2 Å), or thin nonmagnetic alloy layers like CoFeGe, NiFeGe, CoFeGeAg, etc. (alloy composition for alloys with Ge should be greater than about 44 at. % Ge to render the alloy nonmagnetic). When alloyed with nonmagnetic materials that do not readily intermix with FM layer 414, additional examples of elements, compounds, or crystalline/amorphous/nanocrystalline materials that may be utilized as the barrier layer include: Ge/CoFe/NiFeTaN (where Ge/CoFe may form a single layer at room temperature or may be deposited as an alloy layer, and where Ge has a thickness of about 6 Å, CoFe has a thickness of about 4 Å, and NiFeTaN has a thickness of about 3 Å); Ge/CoFe/MgO (where Ge/CoFe may form a single layer at room temperature or may be deposited as an alloy layer, and where Ge has a thickness of about 6 Å, CoFe has a thickness of about 4 Å, and MgO has a thickness of about 3 Å); and MgO/Ge/CoFe (where Ge/CoFe may form a single layer at room temperature or may be deposited as an alloy layer, and where MgO has a thickness of about 3 Å, Ge has a thickness of about 6 Å, and CoFe has a thickness of about 4 Å). Examples of a barrier layer 416 or an interlayer 412 using alloys with $X_2YZ$ Heusler alloys would be Ge/$Co_2FeGe$ (which may form a single layer at room temperature or may be deposited as an alloy layer, and where Ge is about 4 Å thick and $Co_2FeGe$ is about 5 Å thick); or using alloys with XYZ half Heusler alloys like Ge/CoFeGe (which may form a single layer at room temperature or may be deposited as an alloy layer, where Ge is about 3 Å thick and CoFeGe is about 6A Å thick); and Ge/CoA (which may form a single layer at room temperature or may be deposited as an alloy layer), Ge/FeA (which may form a single layer at room temperature or may be deposited as an alloy layer), or Ge/NiA (which may form a single layer at room temperature or may be deposited as an alloy layer), where A can be one or more elements belonging to full Heusler alloys $X_2YZ$ or half Heusler alloys XYZ; or used in combination with very thin (i.e., dusting layers about 1 Å to about 5 Å thick) of nonmagnetic seed or capping layers of alloys of CuAg, NiCr, CoCu, AgSn, etc., such as Ge/$X_2YZ$/CuAg, Ge/$X_2YZ$/CuNi, CuNi/Ge/$X_2YZ$, or CuAg/Ge/$X_2YZ$/CuNi. The alloy composition should be nonmagnetic as in the case of alloys with one of the aforementioned non-interacting elements or alloys of these elements like Ge where Ge exceeds about 44 at. % to render the alloy nonmagnetic.

The barrier layer 416 may comprise multilayer stacks comprising one or more of the aforementioned elements, compounds, or crystalline/amorphous/nanocrystalline metals. The thickness in the y-direction of the barrier layer 416 may be about 3 Å to about 100 Å, depending on resistivity of the barrier layer 416, and how effective the barrier layer 416 is at reducing FM intermixing and FM shunting in the SOT device 400, 450, 500.

The interlayer 412 may comprise any of the aforementioned elements, compounds, or crystalline/amorphous/ nanocrystalline metals that the barrier layer 416 may comprise. Additionally, the interlayer 412 may comprise nonmagnetic alloy or multilayer stack containing one or more of the following elements Cu, Ag, Ge, Mn, Ni, Co, Mo, W, In, B, and Sn; or in conjunction with magnetic alloys such as CoA, FeA, and NiA, where A can be one or more elements belonging to full Heusler alloys $X_2YZ$ or half Heusler alloys XYZ, where X is selected from the group consisting of: Mn, Fe, Co, Ni, Cu, Ru, Rh, Pd, Ag, Ir, Pt, and Au; where Y is selected from the group consisting of: Ti, V, Cr, Mn, Fe, Co, Ni, Zn, Y, Zr, Nb, Mo, Hf and W; and where Z is selected from the group consisting of: B, Al, Si, Ga, Ge, As, In, Sn, Sb, and Bi. The magnetic alloys or Heusler alloys should combine with other layers, combinations of elements, or other alloys to form a nonmagnetic layer or multilayer stack after room temperature deposition and intermixing, or deposited as a nonmagnetic single layer alloy, or in combinations thereof. The overall total thickness of the interlayer 412 is less than about 20 Å, such as about 3 Å to about 15 Å to ensure adequate magnetic coupling of the FM layer 414 to the BiSb layer 410. Nonmagnetic polycrystalline Heusler alloys may also be used for the interlayer 412, such as $V_2VAl$ or $[Mn_{0.5}Co_{0.5}]_2VAl$, etc.

The interlayer 412 should have higher resistivity and be nonmagnetic. Thin, high resistivity, low Z ceramic oxide and nitride layers of TiN, SiN, $Al_2O_3$, MgO, thin layers can be used in the interlayer 412. Furthermore, other materials that may be used as the interlayer 412 if not disposed in direct contact with the BiSb layer 410 include: high resistivity, heavier metal amorphous/nanocrystalline metals such as NiFeTa, NiTa, NiWTa, NiFeW, NiW, and WRe; nanocrystalline metals like beta-Ta or beta-W; or nitrides, oxides, or borides of the aforementioned elements or alloys such as NiTaN, NiFeTaN, NiWTaN, NiWN, WReN, TaN, WN, TaOx, WOx, TaBx, WBx, and HfBx. Higher resistivity, nonmagnetic alloys which don't readily interact with the BiSb layer 410 or the FM layer 414 may also be used for the interlayer 412, such as Cu, Ag, Ge, Mn, Ni, Co Mo, W, Sn, B, In, and multi-element alloys combinations thereof, like CuAg, CuNi, NiAg, CoCu, NiAl, RuAl, RhAl, CuCo, and AgSn.

Examples of high resistive, amorphous materials for the interlayer 412 include Ge (6 Å)/CoFe (4 Å)/CuAg (3 Å) (which may form a single layer at room temperature or may be deposited as an alloy layer), CuAg (3 Å)/Ge (5 Å)/CoFe (3 Å)/CuAg (2 Å) (which may form a single layer at room temperature or may be deposited as an alloy layer), or single alloy nonmagnetic layers of CoFeGe, NiFeGe, CoFeGeAg, among others. The interlayer 412 may comprise thin multilayer stacks consisting of the aforementioned elements, compounds, or crystalline/amorphous/nanocrystalline layers as long as the overall multilayer stack is nonmagnetic and has a high resistivity.

Magnetic alloys and magnetic Heusler alloys can be used if used in combinations with other elements or alloys above such that when deposited, the materials intermix at room temperature, or after post annealing, to form a nonmagnetic stack. Examples include layers of NiFeX, CoFeX, NiX, FeX, CoX, where X is an element that does not readily interact with BiSb, such as Cu, Ag, Ge, Mn, Ni, Co, Mo, W, Sn, B, and In, or magnetic Heusler alloys deposited on non-interacting element or alloy layers like Ge layers and in single alloy deposition layers where the resulting Ge content in the intermixed alloy renders it nonmagnetic (e.g., in the case of alloying with Ge the Ge content should be greater than or equal to about 44 at. %); or in combination with sufficiently thick layers of elements which do not readily interact with BiSb, such as Cu, Ag, Ge, Mn, Ni, Co, Mo, W, Sn, B, and In, to form multi-element, nonmagnetic, high resistivity combinations thereof; or single polycrystalline nonmagnetic Heusler layers.

Another example of materials that may be used for the interlayer 412 include: Ge/CoFe/NiFeTaN (where Ge/CoFe may form a single layer at room temperature or may be deposited as an alloy layer, and where Ge has a thickness of about 6 Å, CoFe has a thickness of about 4 Å, and NiFeTaN has a thickness of about 3 Å).

Moreover, materials similar to the interlayer 412 can be used in the barrier layer 416 as long as those materials don't readily mix with the FM layer 414, such as Cu, Ag, Ge, Mn, Ni, Co Mo, W, Sn, B, In, and alloy combinations thereof, when used in alloy combinations with Ge to form graded nonmagnetic layers, such as NiFeGe, CoFeGe, CoCu, NiCu, and CuAg alloys, or Heusler alloy combinations mixed with Ge, where the Ge content is about greater than or equal to about 44 atomic percent (at. %). The Ge content being about greater than or equal to about 44 at. % ensures even magnetic Heusler alloys are nonmagnetic when intermixed with Ge, or deposited as a single alloy with Ge>44%, or in combination with other non-mixing elements (i.e., Cu, Ag, Mn, Mo, Ni, W, In, B, and Sn) such that the final thin multilayer interlayer 412 and/or barrier layer 416 after deposition mixing or post annealing is nonmagnetic.

In the STO device 450 of FIG. 4B, the first interlayer 454 may comprise any nonmagnetic material listed above, such as a polycrystalline nonmagnetic Heusler alloy, or high resistivity fcc oxide layer like a thin MgO tunnel barrier. The second interlayer 456 may comprise a magnetic material, such as polycrystalline magnetic Heusler alloys. Magnetic Heusler examples have large spin polarizations, and examples of magnetic Heusler alloys that can be used in the second interlayer 456 include $Co_2MnSb$, $Co_2MnGe$, CoMnSb, NiMnSb, $Co_2FeGe$, $Co_2MnSn$, and $Co_2MnFeGe$, which do not readily mix with BiSb layer 410. In the STO device 450 of FIG. 4B, a thickness of the first interlayer 454 and the second interlayer 456 in the y-direction is collectively between about 5 Å to about 20 Å.

The nucleation layer 408 may comprise any of the same materials as the barrier layer 416 and/or interlayer 412; or a nanocrystalline to polycrystalline epitaxial layer like a nonmagnetic Heusler alloy; or bcc or B2 non-interacting material with the SOT. Additionally, the nucleation layer 408 may comprise elements which do not readily interact with either the Bi or the Sb of the BiSb layer 410, such as Cu, Ag, Ge, Mn, Co, Ni, Mo, Sn, In, B, and W; or in multiple element alloy combinations thereof, such as CuAg, CuNi, CuCo, and AgSn; or low Fe alloys thereof, or one or more of these elements or combination of elements. Further examples of materials that may be used as dusting layers of the nucleation layer 408 include Ge having a thickness between about 2 Å to about 6 Å, CuAg having a thickness between about 2 Å to about 5 Å, and CuNi having a thickness between about 2 Å to about 5 Å. The nucleation layer 408 may have a thickness in the y-direction of about 1 Å to about 10 Å.

The buffer layer 406 may comprise any of the same materials as the barrier layer 416 and/or interlayer 412. The buffer layer 406 may further comprise any of the above-listed materials used in the interlayer 412, such as a single alloy layer or layer combinations; nonmagnetic alloys or multilayer stacks comprising one or more of the following elements Cu, Ag, Ge, Mn, Ni, Mo, and W; or multi-element alloy combinations thereof; or in conjunction with magnetic and or nonmagnetic alloys such as CoA, FeA, NiA, where A is one or more elements belonging to full Heusler alloys $X_2YZ$ or half Heusler alloys XYZ, where X is selected from the group consisting of: Mn, Fe, Co, Ni, Cu, Ru, Rh, Pd, Ag, Ir, Pt, and Au; Y is selected from the group consisting of: Ti, V, Cr, Mn, Fe, Co, Ni, Zn, Y, Zr, Nb, Mo, Hf, and W; and Z is selected from the group consisting of: B, Al, Si, Ga, Ge, As, In, Sn, Sb, and Bi. The magnetic alloy or Heusler alloys should combine with other elements such as Cu, Ag, Ge, Mn, Co, Ni, Mo, Sn, In, B, and W, or combine in multi-elemental alloy layers thereof, to form a nonmagnetic total stack buffer layer 406. The buffer layer 406 may be thin or relatively thick, such as having a thickness in the y-direction of about 5 Å to about 100 Å. A thicker buffer layer 406 can provide better migration resistance against elements from neighboring stacks getting into the BiSb layer 410, or provide better migration resistance of the Bi or the Sb migration out of the BiSb layer 410. The buffer layer 406 can be made thicker by lamination of layers to better control SOT nucleation/growth and texture.

Additional examples of materials that can be used for the buffer layer 406 include: [Ge/$X_2YZ$]*n laminations, [Ge/XYZ]*n laminations, and [Ge/XYZ]*n laminations, where n is a whole numeral; Ge-enriched $X_2YZ$ and Ge-enriched XYZ single layer alloys such that the buffer layer 406 is nonmagnetic (i.e., Ge>44%); [Ge (6 Å)/Co$_2$(MnFe)Ge (4 Å)]*4, [Ge (3 Å)/CoFeGe (6 Å)]*3, and [Ge (6 Å)/NiFe (4 Å)]*n; and with Ge alloyed or layered with NiA, FeA, CoA in lamination, where A is one or more elements belonging to full Heusler alloys $X_2YZ$ or half Heusler alloys XYZ, for example, [Ge (6 Å)/NiA (4 Å)]*n] where 1<n<4. The overall buffer layer 406 has a thickness between about 10 Å to about 50 Å.

In the SOT devices 400, 450, 500 the BiSb layer 410 is deposited on the buffer layer 406 or the nucleation layer 408. As the BiSb layer 410 is deposited, the BiSb layer 410 may be doped or remain undoped. When the BiSb layer 410 is undoped, the buffer layer 406 (or the nucleation layer 408) promotes the BiSb layer 410 to grow a (001) crystal orientation. When the BiSb layer 410 is doped, the buffer layer 406 (or the nucleation layer 408) promotes the BiSb layer 410 to grow a (012) crystal orientation. The relatively non-interacting dopant used to promote the (012) orientation of BiSb may be, a gas, a metal, a non-metal, or a ceramic material. To create a strong (012) texture, the entire BiSb layer 410 need not be doped, only about the first 10 Å to about 50 Å of the BiSb layer 410 immediately adjacent to the buffer layer 406 (or the nucleation layer 408) needs to be doped. The remaining BiSb layer 410 may then be deposited as undoped BiSb on top of the initially doped portion of BiSb already deposited. Doping only a portion of the BiSb layer 410 is sufficient to promote and grow a (012) orientation of the entire BiSb layer 410. The SOT device 400 can achieve a spin Hall angle (SHA) of about 2 or larger when the BiSb layer 410 has a (012) orientation or a (001) orientation.

Examples of the doping BiSb process is described in co-pending patent application titled "Novel Doping Process To Refine Grain Size For Smoother BiSb Film Surface,"

U.S. application Ser. No. 17/854,568, filed Jun. 30, 2022, assigned to the same assignee of this application, which is herein incorporated by reference.

With respect to each of the SOT devices 400, 450, and 500 of FIGS. 4A-5, in some embodiments, each of the buffer layer 406, the barrier layer 416, and/or interlayer 412 may be a single alloy layer. In other embodiments, each of the buffer layer 406, the barrier layer 416, and/or interlayer 412 may be used as a thicker layer constructed of laminated repeated bilayers. The thicker laminated bilayer aids in controlling (001) or (012) textured BiSb growth and reduces diffusion or migration through the buffer layer 406, the barrier layer 416, and/or interlayer 412.

The buffer layer 406 and the nucleation layer 408 not only provide a strong (001) or (012) texture, the buffer layer 406 and the nucleation layer 408 also prohibit or minimize the migration of Bi and Sb of the BiSb layer 410 from diffusing into or through the buffer layer 406 and the nucleation layer 408. Because the buffer layer 406, the nucleation layer 408, and/or the interlayer 412 has high resistivity (e.g., about 300 μohm-cm), shunting of the BiSb layer 410 is minimized, and SOT-FM intermixing is reduced, which in turn reduces moment loss with the FM layer 414 and improves thermal stability.

It is to be further understood that a plurality of the SOT devices 400 can be configured together as part of a memory cell array in which the BiSb layer 410 is a spin orbit material electrode, where a top electrode 402b can be disposed over the cap layer 418; that a plurality of the SOT devices 450 can be configured together as part of a memory cell array in which the BiSb layer 410 is a spin orbit material electrode, where a top electrode (not shown) can be disposed over the cap layer 418; and that a plurality of the SOT devices 500 can be configured together as part of a memory cell array in which the BiSb layer 410 is a spin orbit material electrode, where a top electrode (not shown) can be disposed over the cap layer 418. Each of the memory cells may be part of a two-terminal device or a three terminal device. The spin orbit material electrode and the top electrode may serve as bit lines, word lines, read word lines, write word lines, and combinations thereof. The memory cell array may be implemented as a cross-point array or other architectures.

As noted above, each of the SOT devices 400, 450, and 500 of FIGS. 4A-5 may be utilized as BiSb STO devices. BiSb based STO devices, such as the SOT devices 400, 450, and 500 of FIGS. 4A-5, typically have a larger SHA as compared to conventional STO based devices under the same input current density. For example, when both a conventional SOT device and the BiSb based STO devices have an input inplane current density of J=$4 \times 10^7$ A/cm$^2$, conventional STO typically have a SHA of about 0.4, whereas the BiSb based STO device has a SHA of about 2 or larger. As the applied magnetic field is increased, the performance of conventional STO devices suffer because a high frequency cannot be achieved. Thus, for conventional STO devices, because of smaller SHA (e.g., 0.4), the detected field range will be smaller. Furthermore, signal sensitivity can be poor. A conventional STO device with a SHA ~0.4 has a sensitivity of about 40 GHz/T, just marginally larger than gyromagnetic ratio ~28 GHz/T. However, in a BiSb based STO device with a SHA of 2 or larger, the linear relationship between detected frequency and the applied magnetic field is expanded in a larger dynamic range. Furthermore, STO signal sensitivity can reach ~100 GHz/T, which is at least twice larger than conventional STO reader. As such, BiSb based STO devices utilized in read heads have a high performance.

Figure 6:
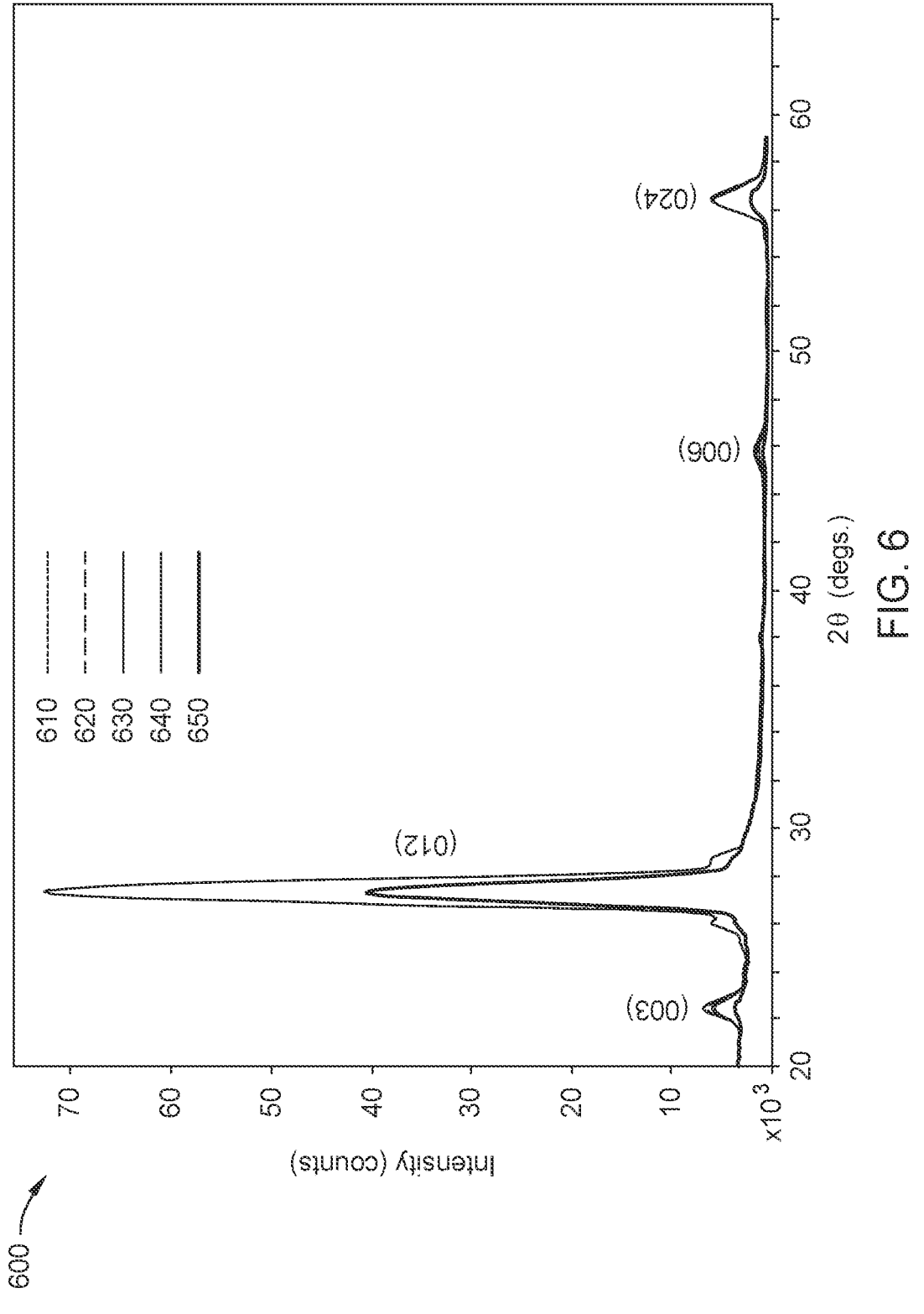
FIG. 6 illustrates a graph showing the crystalline orientation of a BiSb layer for various SOT devices having an interlayer and a barrier layer each comprising a Heusler alloy, according to one embodiment.

FIG. 6 illustrates a graph 600 showing the crystalline orientation of a BiSb layer for various SOT devices having a buffer layer, an interlayer, and a barrier layer each comprising a Heusler alloy, according to one embodiment. For example, the interlayer and the barrier layer of each SOT device may comprise any of the materials listed for the interlayer 412 and barrier layer 416 of FIGS. 4A-5. The BiSb layer may be the BiSb layer 410 of the SOT devices 400, 450, 500, the interlayer may be the interlayer 412 of the SOT devices 400, 450, 500, and the barrier layer may be the barrier layer 416 of the SOT devices 400, 450, 500. In each of the SOT devices represented by lines 610-650, the SOT layer is BiSb doped with 5 at. % CuAg (line 650 has approximately a 10% thinner SOT layer than lines 610-640). For lines 610 through 640, the SOT device comprises a seed layer of NiFeTa having a thickness of about 30 Å, a FM layer comprising CoFe having a thickness of about 10 Å, a buffer layer comprising a lamination of [Ge (6 Å)/$Co_2$ $(Mn_{0.5}Fe_{0.5})$Ge (4 Å)]*4 and Ge/$X_2$YZ Heusler alloy, and a capping layer of NiFeTaN (30 Å)/CuAg (10 Å). The SOT device represented by line 650 comprises a seed layer of NiFeTa having a thickness of about 30 Å, a RuAl texturing layer having a thickness of about 50 Å, a CoFe FM layer having a thickness of about 12 Å, a MgO buffer layer having a thickness of about 10 Å, and a NiFeTaN capping layer having a thickness of about 30 Å. The seed layer may be the seed layer 404 of the SOT devices 400, 450, 500, the FM layer may be the FM layer 414 of the SOT devices 400, 450, 500, and the buffer layer may be the buffer layer 406 of the SOT devices 400, 450, 500.

In the graph 600, line 610 represents an SOT device comprising an interlayer comprising Ge/CoFe/CuAg, where Ge has a thickness of about 6 Å, CoFe has a thickness of about 4 Å, and CuAg has a thickness of about 3 Å, and a barrier layer comprising Ge/CoFe/CuAg, where Ge has a thickness of about 6 Å, CoFe has a thickness of about 4 Å, and CuAg has a thickness of about 3 Å. Line 620 represents an SOT device comprising an interlayer comprising Ge/CoFe/CuAg, where Ge has a thickness of about 6 Å, CoFe has a thickness of about 4 Å, and CuAg has a thickness of about 3 Å, and a barrier layer comprising MgO, where MgO has a thickness of about 5 Å. Line 630 represents an SOT device comprising an interlayer comprising Ge/CoFe/NiFeTaN, where Ge has a thickness of about 6 Å, CoFe has a thickness of about 4 Å, and NiFeTaN has a thickness of about 3 Å, and a barrier layer comprising Ge/CoFe/CuAg, where Ge has a thickness of about 6 Å, CoFe has a thickness of about 4 Å, and CuAg has a thickness of about 3 Å. Line 640 represents an SOT device comprising an interlayer of CuAg/Ge/$Co_2$FeGe/CuAg, where CuAg has a thickness of about 3 Å, Ge has a thickness of about 4 Å, $Co_2$FeGe has a thickness of about 5 Å, and CuAg has a thickness of about 2 Å, and a barrier layer comprising MgO, where MgO has a thickness of about 5 Å. The SOT device in line 650 is comprised of a MgO buffer layer of 10 Å, and interlayer comprised of Ge/CoFe/MgO where Ge has a thickness of 6 Å, CoFe has a thickness of 4 Å, and MgO has a thickness of 3 Å, with no barrier layer.

As shown by each of lines 610-640, the BiSb layer achieves a higher (012) crystalline orientation, compared to SOT devices that do not have a buffer layer, an interlayer, and a barrier layer comprising a Heusler alloy as one of the layers. Thus, utilizing Heusler alloys for the interlayer, the barrier layer, and/or the buffer layer results in the BiSb layer achieving a strong (012) orientation.

Figure 7A:
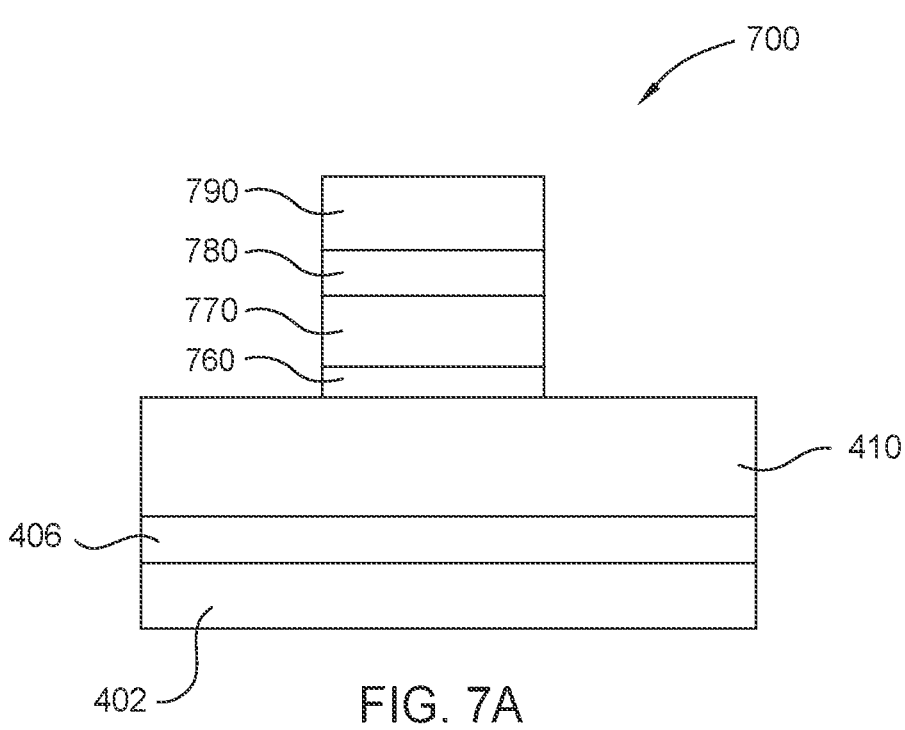
FIG. 7A is a schematic cross-sectional view of a SOT device for use in a MAMR write head, such as in the magnetic recording head of the drive of FIG. 1 or other suitable magnetic media drives.

FIG. 7A is a schematic cross-sectional view of a SOT device 700 for use in a MAMR write head, such as a MAMR write head that can be used as part of the magnetic recording head of the drive 100 of FIG. 1 or other suitable magnetic media drives. The SOT device 700 comprises a doped BiSb layer 410 with a (001) orientation, or alternatively, an undoped BiSb layer 410 with a (012) orientation, formed over a buffer layer 406 (or nucleation layer 408), formed over a shield or substrate 402, such as the BiSb layer 410 of FIGS. 4A-5. The buffer layer 406 may comprise a Heusler alloy as described above in FIGS. 4A-5, and have the same or similar properties as described above with respect to various embodiments. A spin torque layer (STL) 770 is formed over the BiSb layer 410. The STL 770 comprises a ferromagnetic material such as one or more layers of CoFe, CoIr, NiFe, and CoFeX alloy wherein X=B, Ta, Re, or Ir. The STL 770 may be a free layer, such as the free layers 307a, 307b of FIGS. 3A-3C. As such, the STL 770 may be referred to as a free layer.

In certain embodiments, an electrical current shunt block layer 760 is disposed between the BiSb layer 410 and the STL 770. The electrical current shunt blocking layer 760 reduces electrical current from flowing from the BiSb layer 410 to the STL 770 but allows spin orbital coupling of the BiSb layer 410 and the STL 770. In certain embodiments, the electrical current shunt blocking layer 760 comprises a magnetic material which provides greater spin orbital coupling between the BiSb layer 410 and the STL 770 than a non-magnetic material. In certain embodiments, the electrical current shunt blocking layer 760 comprises FeCo, FeCoM, FeCoMO, FeCoMMeO, FeCoM/MeO stack, FeCoMNiMnMgZnFeO, FeCoM/NiMnMgZnFeO stack, multiple layers/stacks thereof, or combinations thereof in which M is one or more of B, Si, P, Al, Hf, Zr, Nb, Ti, Ta, Mo, Mg, Y, Cu, Cr, and Ni, and Me is Si, Al, Hf, Zr, Nb, Ti, Ta, Mg, Y, or Cr. In certain embodiments, the electrical current shunt blocking layer 760 is formed to a thickness from about 10 Å to about 100 Å. In certain aspects, an electrical current shunt blocking layer 760 having a thickness of over 100 Å may reduce spin orbital coupling of the BiSb layer 410 and the STL 770. In certain aspects, an electrical current shunt blocking layer having a thickness of less than 10 Å may not sufficiently reduce electrical current from BiSb layer 410 to the STL 770.

In certain embodiments, additional layers are formed over the STL 770 such as a spacer layer 780 and a pinning layer 790. The pinning layer 790 can partially pin the STL 770. The pinning layer 790 comprises a single or multiple layers of PtMn, NiMn, IrMn, IrMnCr, CrMnPt, FeMn, other anti-ferromagnetic materials, or combinations thereof. The spacer layer 780 comprises single or multiple layers of magnesium oxide, aluminum oxide, other non-magnetic materials, or combinations thereof.

Figure 7B:
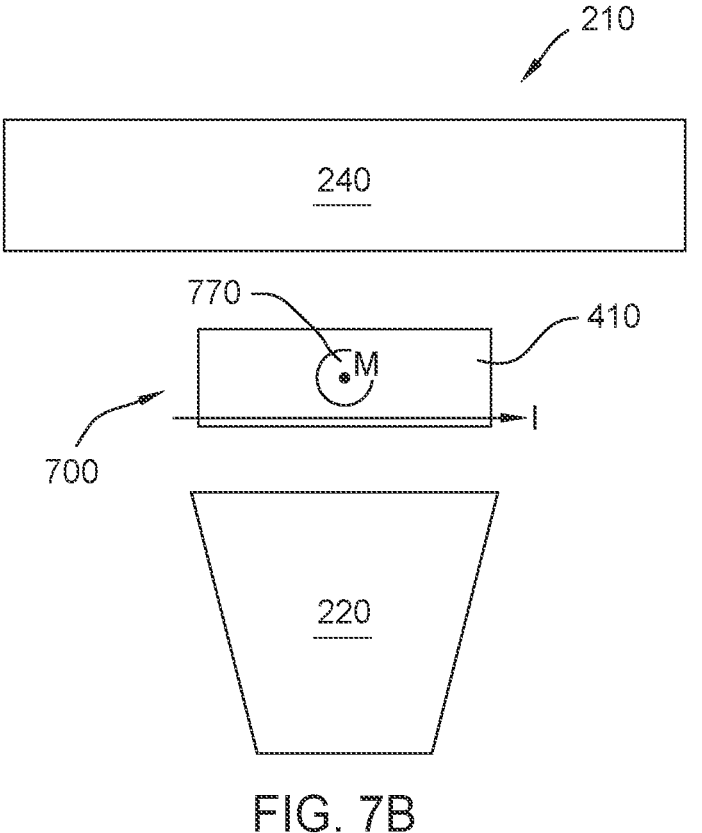
FIGS. 7B-7C are schematic MFS views of certain embodiments of a portion of a MAMR write head with a SOT device of FIG. 7A.
Figures 7C, 8:
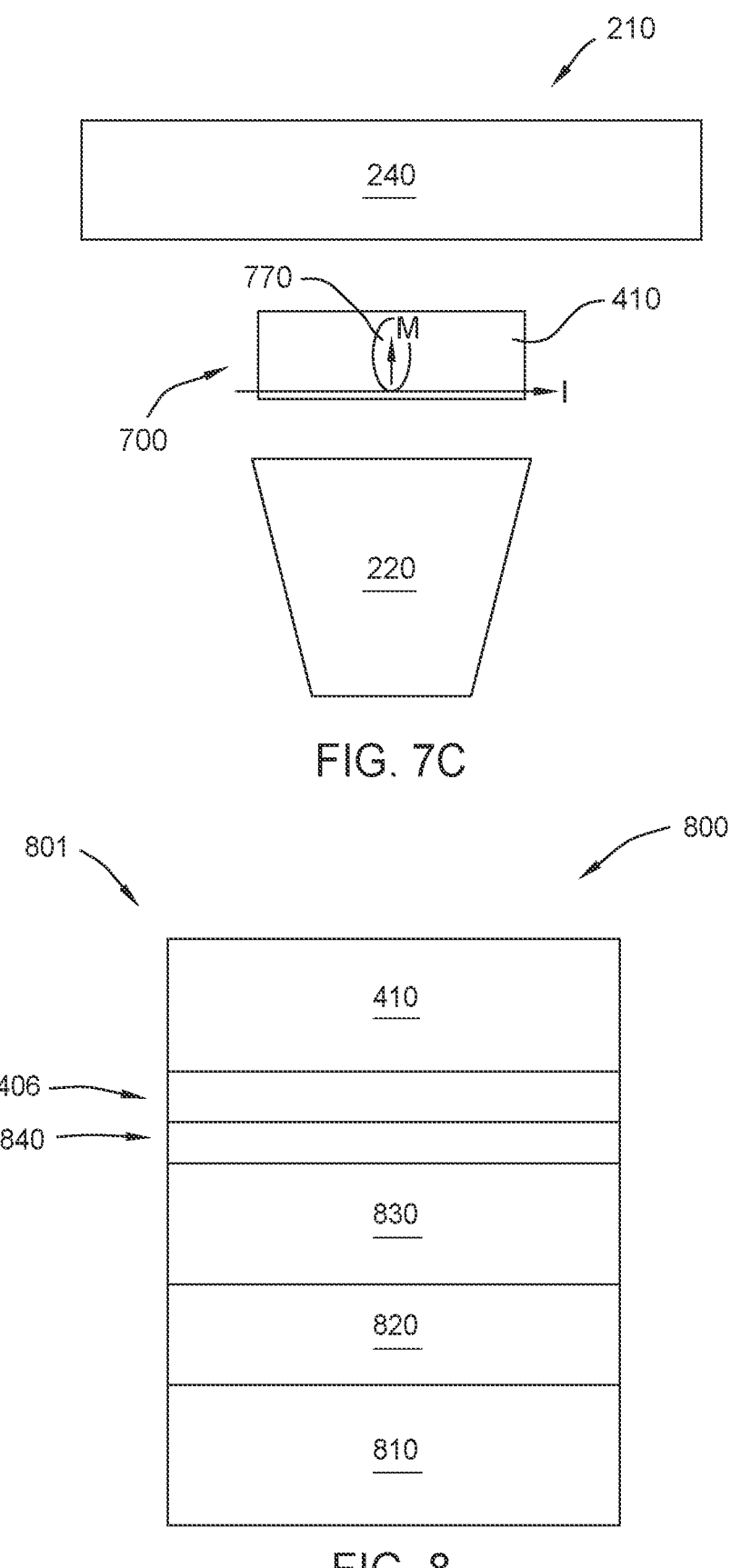
FIG. 8 is a schematic cross-sectional view of a SOT used as a MRAM device.

FIGS. 7B-7C are schematic MFS views of certain embodiments of a portion of a MAMR write head 210 with a SOT device 700 of FIG. 7A. The MAMR write head 210 can be the write head in FIG. 2 or other suitable write heads usable in the drive 100 of FIG. 1 or other suitable magnetic media drives such as tape drives. The MAMR write head 210 includes a main pole 220 and a trailing shield 240 in a down-track direction. The SOT device 700 is disposed in a gap between the main pole 220 and the trailing shield 240.

During operation, charge current through a BiSb layer or layer stack 410 acting as a spin Hall layer generates a spin current in the BiSb layer. The spin orbital coupling of the BiSb layer and a spin torque layer (STL) 770 causes switching or precession of magnetization of the STL 770 by the spin orbital coupling of the spin current from the BiSb layer 410. Switching or precession of the magnetization of the STL 770 can generate an assisting AC field to the write field. Energy assisted write heads based on SOT have multiple times greater power efficiency in comparison to MAMR write heads based on spin transfer torque. As shown in FIG. 7B, an easy axis of a magnetization direction of the STL 770 is perpendicular to the MFS from shape anisotropy of the STL 770, from the pinning layer 790 of FIG. 7A, and/or from hard bias elements proximate the STL 770. As shown in FIG. 7C, an easy axis of a magnetization direction of the STL 770 is parallel to the MFS from shape anisotropy of the STL 770, from the pinning layer 790 of FIG. 7A, and/or from hard bias elements proximate the STL 770.

FIG. 8 is a schematic cross-sectional view of a SOT magnetic tunnel junction (MTJ) 801 used as a MRAM device 800. The MRAM device 800 comprises a reference layer (RL) 810, a spacer layer 820 over the RL 810, a recording layer 830 over the spacer layer 820, a buffer layer 406 (or nucleation layer 408) over an electrical current shunt block layer 840 over the recording layer 830, and a BiSb layer or layer stack 410 over the buffer layer 406. The BiSb layer 410 may be the BiSb layer 410 of FIGS. 4A-5. The buffer layer 406 may comprise a Heusler alloy as described above in FIGS. 4A-5 and have the same or similar properties as described above with respect to various embodiments. The BiSb layer 410 may be a doped BiSb layer having a (012) orientation or an undoped BiSb layer having a (001) orientation. The RL 810 may be a free layer, such as the free layer 307a, 307b of FIGS. 3A-3C. As such, the RL 810 may be referred to as a free layer.

The RL 810 comprises single or multiple layers of CoFe, other ferromagnetic materials, and combinations thereof. The spacer layer 820 comprises single or multiple layers of magnesium oxide, aluminum oxide, other dielectric materials, or combinations thereof. The recording layer 830 comprises single or multiple layers of CoFe, NiFe, other ferromagnetic materials, or combinations thereof.

As noted above, in certain embodiments, the electrical current shunt block layer 840 is disposed between the buffer layer 406 and the recording layer 830. The electrical current shunt blocking layer 840 reduces electrical current from flowing from the BiSb layer 410 to the recording layer 830 but allows spin orbital coupling of the BiSb layer 410 and the recording layer 830. For example, writing to the MRAM device can be enabled by the spin orbital coupling of the BiSb layer and the recording layer 830, which enables switching of magnetization of the recording layer 830 by the spin orbital coupling of the spin current from the BiSb layer 410. In certain embodiments, the electrical current shunt blocking layer 840 comprises a magnetic material which provides greater spin orbital coupling between the BiSb layer 410 and the recording layer 830 than a non-magnetic material. In certain embodiments, the electrical current shunt blocking layer 840 comprises FeCoM, FeCoMO, FeCoM-MeO, FeCoM/MeO stack, FeCoMNiMnMgZnFeO, FeCoM/NiMnMgZnFeO stack, multiple layers/stacks thereof, or combinations thereof, in which M is one or more of B, Si, P, Al, Hf, Zr, Nb, Ti, Ta, Mo, Mg, Y, Cu, Cr, and Ni, and Me is Si, Al, Hf, Zr, Nb, Ti, Ta, Mg, Y, or Cr.

The MRAM device 800 of FIG. 8 may include other layers, such as pinning layers, pinning structures (e.g., a synthetic antiferromagnetic (SAF) pinned structure), electrodes, gates, and other structures. Other MRAM devices besides the structure of FIG. 8 can be formed utilizing an un-doped BiSb layer 410 with a (001) orientation, or alternatively, a doped BiSb layer 410 with a (012) orientation, over a buffer layer 406 to form a SOT MTJ 801.

Therefore, when one or more of the buffer layer, the interlayer, the barrier layer, and the nucleation layer of SOT devices comprise amorphous/nanocrystalline Heusler alloys, or polycrystalline Heusler alloys, alloyed with other elements that don't readily mix with the BiSb layer, such layers have a high resistance and reduce interlayer/barrier layer intermixing with the BiSb layer or intermixing with the FM layer. Heusler alloys generally have higher resistivities than the FM layer, and transport spin currents or high spin polarization, while providing and maintaining (100) growth. Heusler alloys further have excellent lattice matching capabilities to MgO tunnel barrier layers and to bcc FM alloys. (100) texturing layers can be used to establish the (100) texture, and non-magnetic Heusler $X_2YZ$ or XYZ having cF16 (C1b, L21) or B2 structures can be used to transmit the texture to the BiSb layer, which in turn grows a strong (012) texture for the BiSb layer and a strong (100) texture for the FM layer. As such, one or more of the buffer layer, the interlayer, the barrier layer, and the nucleation layer of SOT devices comprising amorphous/nanocrystalline Heusler alloys, or polycrystalline Heusler alloys, alloyed with other elements that don't readily mix with the BiSb layer, result in SOT devices having improved overall performance.

In one embodiment, a SOT device comprises a first nonmagnetic layer comprising a Heusler alloy and a material selected from the group consisting of: Cu, Ag, Ge, Mn, Ni, Co, Mo, W, Sn, B, and In, and a bismuth antimony (BiSb) layer disposed in contact with the first nonmagnetic layer.

The SOT device further comprises a second nonmagnetic layer comprising a Heusler alloy and a material selected from the group consisting of: Cu, Ag, Ge, Mn, Ni, Co, Mo, W, Sn, B, and In. The second nonmagnetic layer is disposed in contact with the BiSb layer. The first nonmagnetic layer is a buffer layer and wherein the second nonmagnetic layer is an interlayer. The interlayer has a thickness less than or equal to about 20 Å, and the buffer layer has a thickness between about 5 Å to about 200 Å. The SOT device further comprises a third nonmagnetic layer comprising a Heusler alloy and a material selected from the group consisting of: Cu, Ag, Ge, Mn, Ni, Co, Mo, W, Sn, B, and In, and a ferromagnetic layer disposed in contact with the third nonmagnetic layer. The first nonmagnetic layer is further disposed in contact with the ferromagnetic layer. The Heusler alloy is a full Heusler alloy comprising $X_2YZ$, where X is selected from the group consisting of: Mn, Fe, Co, Ni, Cu, Ru, Rh, Pd, Ag, Ir, Pt, and Au, Y is selected from the group consisting of: Ti, V, Cr, Mn, Fe, Co, Ni, Zn, Y, Zr, Nb, Mo, Hf, and W, and Z is selected from the group consisting of: B, Al, Si, Ga, Ge, As, In, Sn, Sb, and Bi. The Heusler alloy is a half Heusler alloy comprising XYZ, where X is selected from the group consisting of: Mn, Fe, Co, Ni, Cu, Ru, Rh, Pd, Ag, Ir, Pt, and Au, Y is selected from the group consisting of: Ti, V, Cr, Mn, Fe, Co, Ni, Zn, Y, Zr, Nb, Mo, Hf, and W, and Z is selected from the group consisting of: B, Al, Si, Ga, Ge, As, In, Sn, Sb, and Bi. The polycrystalline non-Heusler alloy material is selected from the group consisting of: NiAl, RuAl, RhAl, $Mn_3Al$, V, Mo, W, TiW, CrX, where x=Ti, Ru, Mo, or W; CrMo, CrMoTi, Cr, MoV, CrMoW, where Mo is between about 20% atomic percent to about 50% atomic percent; $V_2VAl$; and CrXY, where X and Y are each individually selected from the group consisting of: Al, Ti, Mn, Co, Ni, Ru, Mo, Rh, W, and V. A magnetic recording head comprising the SOT device. A magnetic recording device comprising the magnetic recording head. A magneto-resistive memory comprising the SOT device. A magnetic sensor comprising the SOT device.

In another embodiment, a SOT device comprises a texture layer, a nonmagnetic buffer layer disposed on the texture layer, a bismuth antimony (BiSb) layer over the nonmagnetic buffer layer, a nonmagnetic interlayer disposed on the BiSb layer, a ferromagnetic layer disposed on the nonmagnetic interlayer, and a nonmagnetic barrier layer disposed on the ferromagnetic layer, wherein one or more of the nonmagnetic barrier layer, the nonmagnetic interlayer, and the nonmagnetic buffer layer comprise a Heusler alloy and a material selected from the group consisting of: Cu, Ag, Ge, Mn, Ni, Co, Mo, W, Sn, B, and In.

Each of the nonmagnetic barrier layer, the nonmagnetic interlayer, and the nonmagnetic buffer layer comprise a Heusler alloy and a material selected from the group consisting of: Cu, Ag, Ge, Mn, Ni, Co, Mo, W, Sn, B, and In. The SOT device further comprises a nucleation layer disposed between the nonmagnetic buffer layer and the BiSb layer, the nucleation layer comprising a Heusler alloy and a material selected from the group consisting of: Cu, Ag, Ge, Mn, Ni, Co, Mo, W, Sn, B, and In. The Heusler alloy is a full Heusler alloy comprising $X_2YZ$, where X is selected from the group consisting of: Mn, Fe, Co, Ni, Cu, Ru, Rh, Pd, Ag, Ir, Pt, and Au, Y is selected from the group consisting of: Ti, V, Cr, Mn, Fe, Co, Ni, Zn, Y, Zr, Nb, Mo, Hf, and W, and Z is selected from the group consisting of: B, Al, Si, Ga, Ge, As, In, Sn, Sb, and Bi. The Heusler alloy is a half Heusler alloy comprising XYZ, where X is selected from the group consisting of: Mn, Fe, Co, Ni, Cu, Ru, Rh, Pd, Ag, Ir, Pt, and Au, Y is selected from the group consisting of: Ti, V, Cr, Mn, Fe, Co, Ni, Zn, Y, Zr, Nb, Mo, Hf, and W, and Z is selected from the group consisting of: B, Al, Si, Ga, Ge, As, In, Sn, Sb, and Bi. The SOT device further comprises an amorphous seed layer disposed in contact with the texture layer, and a cap layer disposed on the nonmagnetic barrier layer. The polycrystalline non-Heusler alloy material is selected from the group consisting of: NiAl, RuAl, RhAl, $Mn_3Al$, V, Mo, W, TiW, CrX, where x=Ti, Ru, Mo, or W; CrMo, CrMoTi, Cr, MoV, CrMoW, where Mo is between about 20% atomic percent to about 50% atomic percent; $V_2VAl$; and CrXY, where X and Y are each individually selected from the group consisting of: Al, Ti, Mn, Co, Ni, Ru, Mo, Rh, W, and V. A magnetic recording head comprising the SOT device. A magnetic recording device comprising the magnetic recording head. A magneto-resistive memory comprising the SOT device. A magnetic sensor comprising the SOT device.

In yet another embodiment, a SOT device comprises a seed layer, a texture layer disposed on the seed layer, a ferromagnetic layer disposed on the texture layer, a nonmagnetic buffer layer disposed on the ferromagnetic layer, a bismuth antimony (BiSb) layer over the nonmagnetic buffer layer, and a nonmagnetic interlayer disposed on the BiSb layer, wherein one or more of the nonmagnetic interlayer and the nonmagnetic buffer layer comprise a Heusler alloy and a material selected from the group consisting of: Cu, Ag, Ge, Mn, Ni, Co, Mo, W, Sn, B, and In.

Each of the nonmagnetic interlayer and the nonmagnetic buffer layer comprise a Heusler alloy and a material selected from the group consisting of: Cu, Ag, Ge, Mn, Ni, Co, Mo, W, Sn, B, and In. The Heusler alloy is a full Heusler alloy comprising $X_2YZ$, where X is selected from the group consisting of: Mn, Fe, Co, Ni, Cu, Ru, Rh, Pd, Ag, Ir, Pt, and Au, Y is selected from the group consisting of: Ti, V, Cr, Mn, Fe, Co, Ni, Zn, Y, Zr, Nb, Mo, Hf, and W, and Z is selected from the group consisting of: B, Al, Si, Ga, Ge, As, In, Sn, Sb, and Bi. The Heusler alloy is a half Heusler alloy comprising XYZ, where X is selected from the group consisting of: Mn, Fe, Co, Ni, Cu, Ru, Rh, Pd, Ag, Ir, Pt, and Au, Y is selected from the group consisting of: Ti, V, Cr, Mn, Fe, Co, Ni, Zn, Y, Zr, Nb, Mo, Hf, and W, and Z is selected from the group consisting of: B, Al, Si, Ga, Ge, As, In, Sn, Sb, and Bi. The polycrystalline non-Heusler alloy material is selected from the group consisting of: NiAl, RuAl, RhAl, $Mn_3Al$, V, Mo, W, TiW, CrX, where x=Ti, Ru, Mo, or W; CrMo, CrMoTi, Cr, MoV, CrMoW, where Mo is between about 20% atomic percent to about 50% atomic percent; $V_2VAl$, and CrXY, where X and Y are each individually selected from the group consisting of: Al, Ti, Mn, Co, Ni, Ru, Mo, Rh, W, and V. A magnetic recording head comprising the SOT device. A magnetic recording device comprising the magnetic recording head. A magneto-resistive memory comprising the SOT device. A magnetic sensor comprising the SOT device.

While the foregoing is directed to embodiments of the present disclosure, other and further embodiments of the disclosure may be devised without departing from the basic scope thereof, and the scope thereof is determined by the claims that follow.

What is claimed is:

1. A spin-orbit torque (SOT) device, comprising:
a first nonmagnetic layer comprising:
    (a) a polycrystalline non-Heusler alloy material, or
    (b) a Heusler alloy and a material selected from the group consisting of: Cu, Ag, Ge, Mn, Ni, Co, Mo, W, Sn, B, and In, wherein the SOT device further comprises:
a bismuth antimony (BiSb) layer disposed in contact with the first nonmagnetic layer;
a second nonmagnetic layer comprising a Heusler alloy and a material selected from the group consisting of: Cu, Ag, Ge, Mn, Ni, Co, Mo, W, Sn, B, and In; and
a ferromagnetic layer disposed in contact with the second nonmagnetic layer.

2. The SOT device of claim 1, further comprising a third nonmagnetic layer comprising a Heusler alloy and a material selected from the group consisting of: Cu, Ag, Ge, Mn, Ni, Co, Mo, W, Sn, B, and In.

3. The SOT device of claim 2, wherein the third nonmagnetic layer is disposed in contact with the BiSb layer.

4. The SOT device of claim 2, wherein the first nonmagnetic layer is a buffer layer and wherein the third nonmagnetic layer is an interlayer.

5. The SOT device of claim 4, wherein the interlayer has a thickness less than or equal to about 20 Å, and wherein the buffer layer has a thickness between about 5 Å to about 200 Å.

6. The SOT device of claim 1, wherein the first nonmagnetic layer is further disposed in contact with the ferromagnetic layer.

7. The SOT device of claim 1, wherein the Heusler alloy is a full Heusler alloy comprising $X_2YZ$, where X is selected from the group consisting of: Mn, Fe, Co, Ni, Cu, Ru, Rh, Pd, Ag, Ir, Pt, and Au, Y is selected from the group consisting of: Ti, V, Cr, Mn, Fe, Co, Ni, Zn, Y, Zr, Nb, Mo, Hf, and W, and Z is selected from the group consisting of: B, Al, Si, Ga, Ge, As, In, Sn, Sb, and Bi.

8. The SOT device of claim 1, wherein the Heusler alloy is a half Heusler alloy comprising XYZ, where X is selected from the group consisting of: Mn, Fe, Co, Ni, Cu, Ru, Rh, Pd, Ag, Ir, Pt, and Au, Y is selected from the group consisting of: Ti, V, Cr, Mn, Fe, Co, Ni, Zn, Y, Zr, Nb, Mo, Hf, and W, and Z is selected from the group consisting of: B, Al, Si, Ga, Ge, As, In, Sn, Sb, and Bi.

9. The SOT device of claim 1, wherein the polycrystalline non-Heusler alloy material is selected from the group consisting of:

NiAl, RuAl, RhAl, $Mn_3Al$, V, Mo, W, TiW, CrX, where x=Ti, Ru, Mo, or W;

CrMo, CrMoTi, Cr, MoV, CrMoW, where Mo is between about 20% atomic percent to about 50% atomic percent;

$V_2VAl$; and

CrXY, where X and Y are each individually selected from the group consisting of: Al, Ti, Mn, Co, Ni, Ru, Mo, Rh, W, and V.

10. A magnetic recording head comprising the SOT device of claim 1.

11. A magnetic recording device comprising the magnetic recording head of claim 10.

12. A magneto-resistive memory comprising the SOT device of claim 1.

13. A magnetic sensor comprising the SOT device of claim 1.

14. A spin-orbit torque (SOT) device, comprising:

a texture layer;

a nonmagnetic buffer layer disposed on the texture layer;

a bismuth antimony (BiSb) layer over the nonmagnetic buffer layer;

a nonmagnetic interlayer disposed on the BiSb layer;

a ferromagnetic layer disposed on the nonmagnetic interlayer; and a nonmagnetic barrier layer disposed on the ferromagnetic layer, wherein each of the nonmagnetic barrier layer, the nonmagnetic interlayer, and the nonmagnetic buffer layer comprise a Heusler alloy and a material selected from the group consisting of: Cu, Ag, Ge, Mn, Ni, Co, Mo, W, Sn, B, and In.

15. The SOT device of claim 14, further comprising a nucleation layer disposed between the nonmagnetic buffer layer and the BiSb layer, the nucleation layer comprising a Heusler alloy and a material selected from the group consisting of: Cu, Ag, Ge, Mn, Ni, Co, Mo, W, Sn, B, and In.

16. The SOT device of claim 14, wherein the Heusler alloy is a full Heusler alloy comprising $X_2YZ$, where X is selected from the group consisting of: Mn, Fe, Co, Ni, Cu, Ru, Rh, Pd, Ag, Ir, Pt, and Au, Y is selected from the group consisting of: Ti, V, Cr, Mn, Fe, Co, Ni, Zn, Y, Zr, Nb, Mo, Hf, and W, and Z is selected from the group consisting of: B, Al, Si, Ga, Ge, As, In, Sn, Sb, and Bi.

17. The SOT device of claim 14, wherein the Heusler alloy is a half Heusler alloy comprising XYZ, where X is selected from the group consisting of: Mn, Fe, Co, Ni, Cu, Ru, Rh, Pd, Ag, Ir, Pt, and Au, Y is selected from the group consisting of: Ti, V, Cr, Mn, Fe, Co, Ni, Zn, Y, Zr, Nb, Mo, Hf, and W, and Z is selected from the group consisting of: B, Al, Si, Ga, Ge, As, In, Sn, Sb, and Bi.

18. The SOT device of claim 14, further comprising:

an amorphous seed layer disposed in contact with the texture layer; and a cap layer disposed on the nonmagnetic barrier layer.

19. A magnetic recording head comprising the SOT device of claim 14.

20. A magnetic recording device comprising the magnetic recording head of claim 19.

21. A magneto-resistive memory comprising the SOT device of claim 14.

22. A magnetic sensor comprising the SOT device of claim 14.

23. A spin-orbit torque (SOT) device, comprising:

a seed layer;

a texture layer disposed on the seed layer;

a ferromagnetic layer disposed on the texture layer;

a nonmagnetic buffer layer disposed on the ferromagnetic layer;

a nonmagnetic nucleation layer disposed on the nonmagnetic buffer layer;

a bismuth antimony (BiSb) layer on the nonmagnetic nucleation layer; and a nonmagnetic interlayer disposed on the BiSb layer, wherein each of the nonmagnetic interlayer, nonmagnetic nucleation layer, and the nonmagnetic buffer layer comprise a Heusler alloy and a material selected from the group consisting of: Cu, Ag, Ge, Mn, Ni, Co, Mo, W, Sn, B, and In.

24. The SOT device of claim 23, wherein the Heusler alloy is a full Heusler alloy comprising $X_2YZ$, where X is selected from the group consisting of: Mn, Fe, Co, Ni, Cu, Ru, Rh, Pd, Ag, Ir, Pt, and Au, Y is selected from the group consisting of: Ti, V, Cr, Mn, Fe, Co, Ni, Zn, Y, Zr, Nb, Mo, Hf, and W, and Z is selected from the group consisting of: B, Al, Si, Ga, Ge, As, In, Sn, Sb, and Bi.

25. The SOT device of claim 23, wherein the Heusler alloy is a half Heusler alloy comprising XYZ, where X is selected from the group consisting of: Mn, Fe, Co, Ni, Cu, Ru, Rh, Pd, Ag, Ir, Pt, and Au, Y is selected from the group consisting of: Ti, V, Cr, Mn, Fe, Co, Ni, Zn, Y, Zr, Nb, Mo, Hf, and W, and Z is selected from the group consisting of: B, Al, Si, Ga, Ge, As, In, Sn, Sb, and Bi.

26. A magnetic recording head comprising the SOT device of claim 23.

27. A magnetic recording device comprising the magnetic recording head of claim 26.

28. A magneto-resistive memory comprising the SOT device of claim 23.

29. A magnetic sensor comprising the SOT device of claim 23.

* * * * *